US012757550B2

(12) United States Patent
Kim et al.

(10) Patent No.: US 12,757,550 B2
(45) Date of Patent: Oct. 6, 2026

(54) DISPLAY DEVICE

(71) Applicant: LG Display Co., Ltd., Seoul (KR)

(72) Inventors: MyeongJun Kim, Goyang-si (KR); Yeongmin Yoon, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 449 days.

(21) Appl. No.: 18/467,467

(22) Filed: Sep. 14, 2023

(65) Prior Publication Data

US 2024/0097092 A1 Mar. 21, 2024

(30) Foreign Application Priority Data

Sep. 19, 2022 (KR) ........................ 10-2022-0117954

(51) Int. Cl.
*H10H 20/857* (2025.01)
*G09F 9/30* (2006.01)
*H10W 90/00* (2026.01)

(52) U.S. Cl.
CPC ........... *H10H 20/857* (2025.01); *G09F 9/301* (2013.01); *H10W 90/00* (2026.01)

(58) Field of Classification Search
CPC ..... H10H 20/857; H10D 86/411; G09F 9/301
See application file for complete search history.

(56) References Cited

U.S. PATENT DOCUMENTS

| | | | | |
|---|---|---|---|---|
| 11,367,845 | B2 | 6/2022 | Zhai | |
| 2018/0124937 | A1* | 5/2018 | Choi | G09F 9/301 |
| 2020/0161267 | A1* | 5/2020 | Jeng | H01L 24/25 |
| 2021/0056873 | A1 | 2/2021 | Jung et al. | |
| 2021/0192988 | A1* | 6/2021 | Kim | H01L 23/5386 |
| 2022/0164005 | A1 | 5/2022 | Ahn et al. | |
| 2022/0165720 | A1 | 5/2022 | Eom et al. | |
| 2022/0165838 | A1 | 5/2022 | Hong et al. | |
| 2023/0215873 | A1 | 7/2023 | Lim et al. | |
| 2023/0255068 | A1* | 8/2023 | Yeon | H10K 59/82 257/40 |

FOREIGN PATENT DOCUMENTS

| | | | | |
|---|---|---|---|---|
| CN | 109346504 B | 6/2021 | | |
| EP | 4033338 A2 | 7/2022 | | |
| KR | 20210023550 A | 3/2021 | | |
| KR | 20210082061 A | 7/2021 | | |
| KR | 20220003774 A | * | 1/2022 | H10K 59/82 |
| KR | 20230103584 A | 7/2023 | | |

* cited by examiner

*Primary Examiner* — Britt Hanley
*Assistant Examiner* — Casey Paul Boatman
(74) *Attorney, Agent, or Firm* — Seed Intellectual Property Law Group LLP

(57) ABSTRACT

According to an aspect of the present disclosure, a display device includes a plurality of pixel substrates disposed on a flexible substrate to be spaced apart from each other and whereon at least one pixel is disposed. The device includes a plurality of connection substrates configured to connect a plurality of adjacent pixel substrates. Each connection substrate includes a curved area and a straight area. The device includes a plurality of connection lines configured to electrically connect pads disposed on the plurality of adjacent pixel substrates on the plurality of connection substrates. The plurality of connection substrates includes a first connection pattern and a second connection pattern which has a different modulus of elasticity from that of the first connection pattern and is disposed only in the curved area, thereby improving a stretching reliability.

26 Claims, 14 Drawing Sheets

DISPLAY DEVICE

CROSS-REFERENCE TO RELATED APPLICATIONS

This application claims the priority of Korean Patent Application No. 10-2022-0117954 filed on Sep. 19, 2022, in the Korean Intellectual Property Office, the disclosure of which is incorporated herein by reference.

BACKGROUND

Technical Field

The present disclosure relates to a display device, and more particularly to a stretchable display device.

Description of the Related Art

As display devices which are used for a monitor of a computer, a television, cellular phone, or the like, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Recently, a display device which is manufactured by forming a display unit and a wiring line on a flexible substrate such as plastic which is a flexible material so as to be stretchable in a specific direction and changed in various forms is getting attention as a next generation display device.

BRIEF SUMMARY

An object to be achieved by the present disclosure is to provide a display device which reduces or minimizes a stress of a stretching line.

Another object to be achieved by the present disclosure is to provide a display device which improves a stretching rate.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a plurality of pixel substrates disposed on a flexible substrate to be spaced apart from each other and whereon at least one pixel is disposed; a plurality of connection substrates configured to connect a plurality of adjacent pixel substrates, among the plurality of pixel substrates and include a curved area and a straight area; and a plurality of connection lines configured to electrically connect pads disposed on the plurality of adjacent pixel substrates on the plurality of connection substrates, the plurality of connection substrates includes a first connection pattern and a second connection pattern which has a different modulus of elasticity from that of the first connection pattern and is disposed only in the curved area, thereby improving a stretching reliability.

Other detailed matters of the exemplary embodiments are included in the detailed description and the drawings.

According to the present disclosure, connection patterns having different moduli of elasticity are disposed below a connection line to improve a stretching rate of a display device.

According to the present disclosure, an opening and a filling member may disperse a stretching stress applied to a curved area.

According to the present disclosure, the connection line is disposed on a neutral plane of a curved area to reduce or minimize a crack of the connection line.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
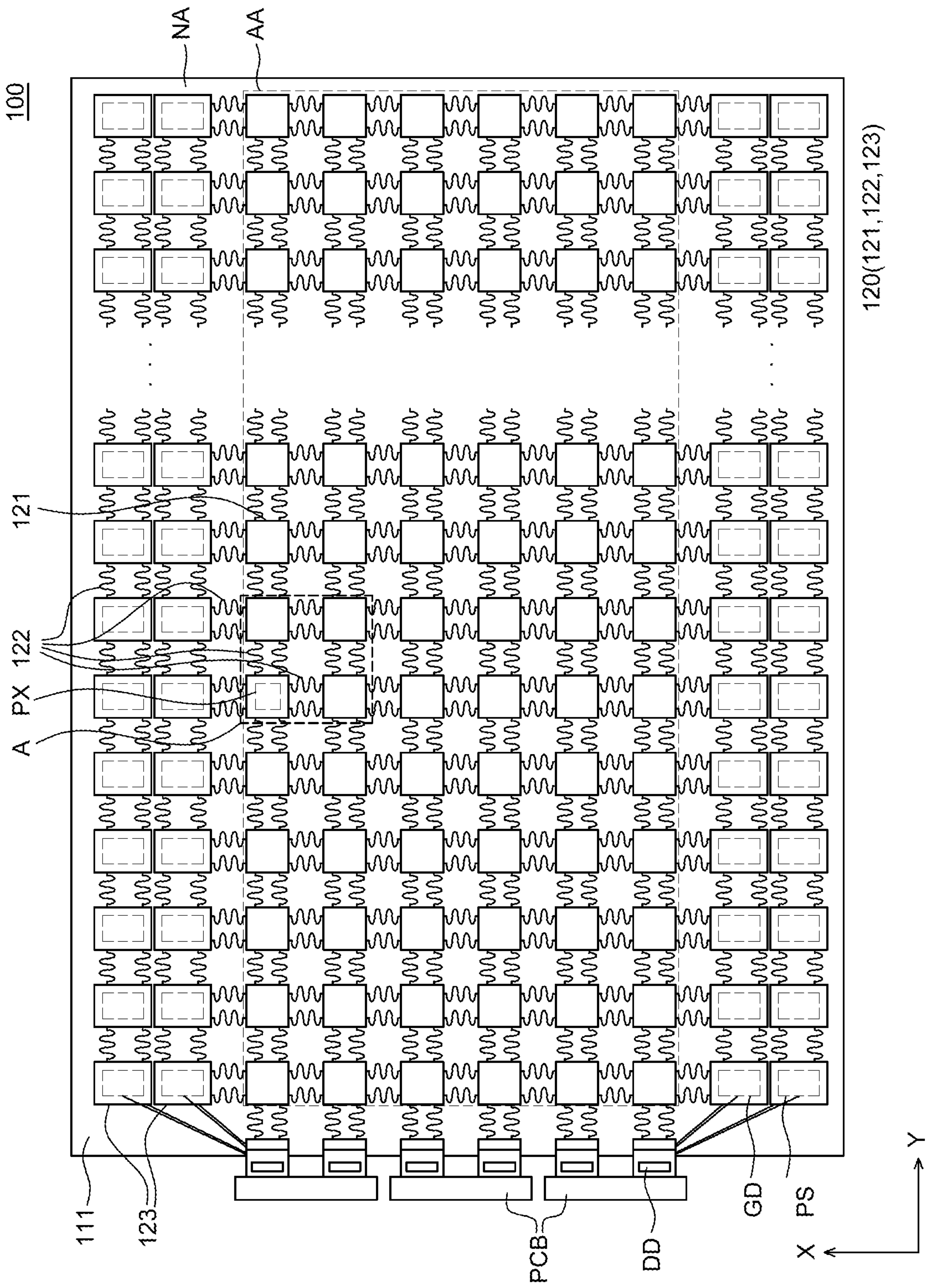
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

A display device according to an exemplary embodiment of the present disclosure is a display device which is capable of displaying images even in a bent or extended state and may be also referred to as a display device, a flexible display device and a stretchable display device. As compared with the general display devices of the related art, the display device may have not only a high flexibility, but also stretchability. Therefore, the user may bend or extend a display device and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface of the wall. Further, when a force applied by the user is removed, the display device may return to its original shape.

Stretchable Substrate and Pattern Layer

FIG. 1 is a plan view of a display device according to an exemplary embodiment of the present disclosure.

Figure 2:
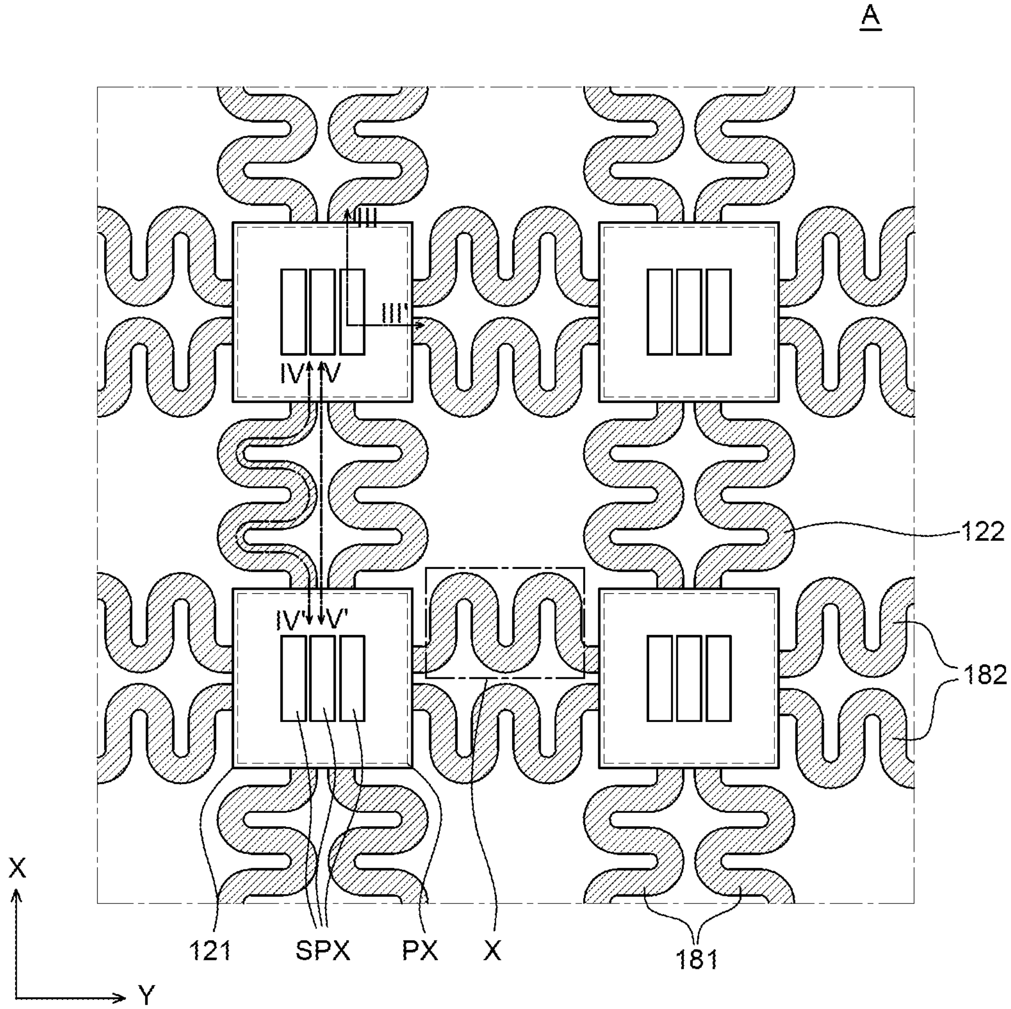
FIG. 2 is an enlarged plan view of an active area of a display device according to an exemplary embodiment of the present disclosure.

FIG. 2 is an enlarged plan view of an active area of a display device according to an exemplary embodiment of the present disclosure.

Figure 3:
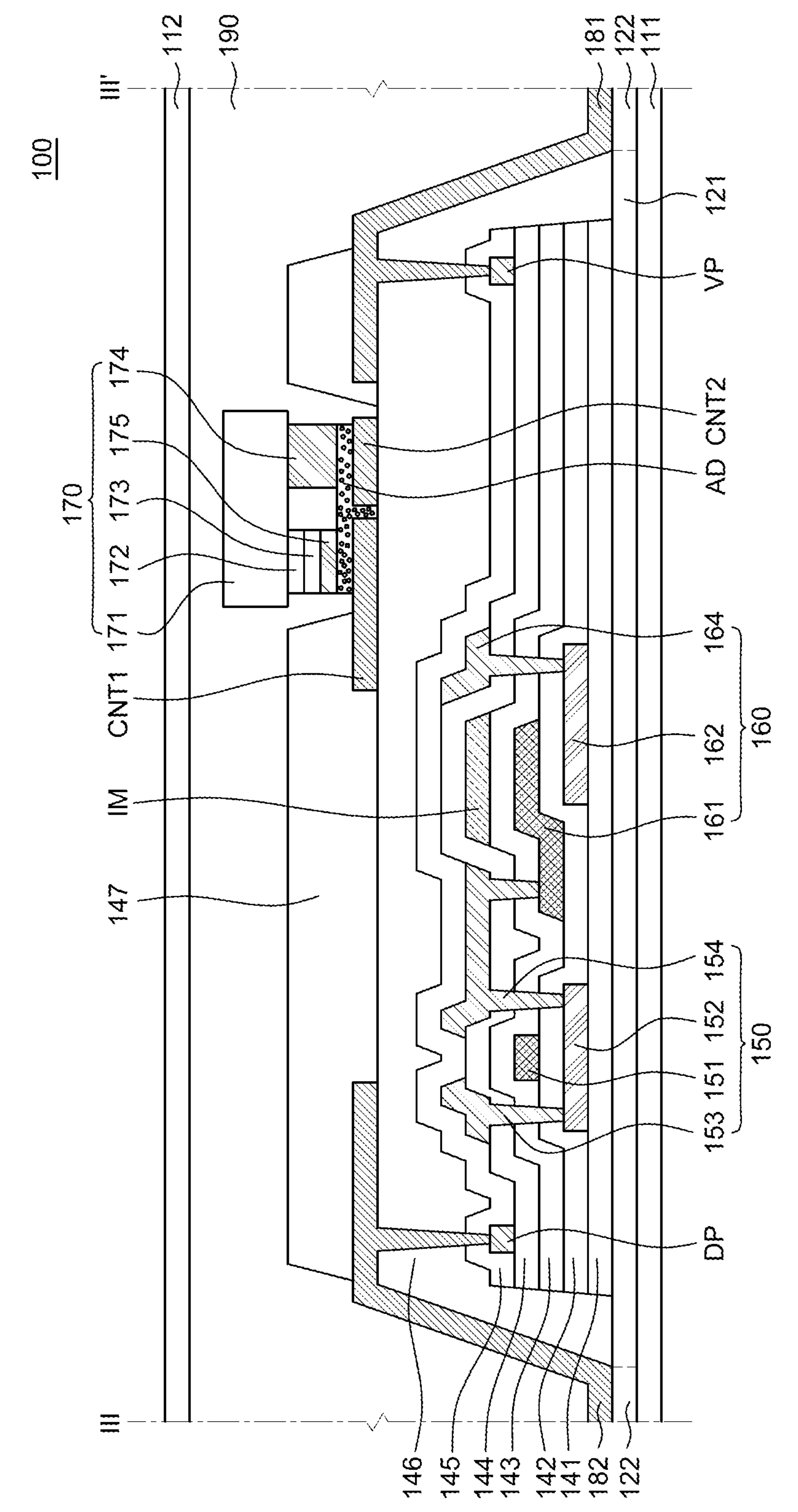
FIG. 3 is a cross-sectional view taken along the line III-III' of FIG. 2.

FIG. 3 is a cross-sectional view taken along the line III-III' of FIG. 2.

Specifically, FIG. 2 is an enlarged plan view of an area A illustrated in FIG. 1.

Referring to FIG. 1, a display device 100 according to an exemplary embodiment of the present disclosure may include a lower substrate 111, a pattern layer 120, a plurality of pixels PX, a gate driver GD, a data driver DD, and a power supply PS. In FIG. 1, for the convenience of description, a filling layer 190 and an upper substrate 112 are not illustrated.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 which are flexible substrates may be configured by an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are flexible substrates so as to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, ductile breaking rates of the lower substrate 111 and the upper substrate 112 may be 100% or higher. Here, the ductile breaking rate refers to a stretching rate at a timing when an object to be stretched is broken or cracked. A thickness of the lower substrate 111 may be 10 um to 1 mm, but is not limited thereto.

The lower substrate 111 may have an active area AA and a non-active area NA which encloses the active area AA. However, the active area AA and the non-active area are not mentioned to be limited to the lower substrate 111, but mentioned for the entire display device 100.

The active area AA is an area in which images are displayed in the display device 100. The plurality of pixels PX is disposed in the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA is an area where no image is displayed. The non-active area NA is an area adjacent to the active area AA. The non-active area NA is adjacent to the active area AA to enclose the active area AA. However, it is not limited thereto so that the non-active area NA corresponds to an area excluding the active area AA from the lower substrate 111 and may be modified and separated in various forms. Components for driving the plurality of pixels PX disposed in the active area AA are disposed in the non-active area NA. That is, the gate driver GD and the power supply PS may be disposed in the non-active area NA. In the non-active area NA, a plurality of pads connected to the gate driver GD and the data driver DD may be disposed and each pad may be connected to each of the plurality of pixels PX of the active area AA.

On the lower substrate 111, a pattern layer 120 including a plurality of pixel substrates 121 and a plurality of connection substrates 122 disposed in the active area AA and a plurality of circuit substrates 123 disposed in the non-active area NA is disposed.

The plurality of pixel substrates 121 is disposed in the active area AA of the lower substrate 111 and a plurality of pixels PX is formed on the plurality of pixel substrates 121. The plurality of circuit substrates 123 may be disposed in the non-active area NA of the lower substrate 111. The gate driver GD and the power supply PS are formed on the plurality of circuit substrates 123.

The plurality of pixel substrates 121 and the plurality of circuit substrates 123 described above may be disposed as island shapes which are spaced apart from each other. The plurality of pixel substrates 121 and the plurality of circuit substrates 123 may be individually separated. Therefore, the plurality of pixel substrates 121 and the plurality of circuit substrates 123 may be referred to as first island patterns and second island patterns or first individual patterns and second individual patterns.

Specifically, the gate driver GD may be mounted in the plurality of circuit substrates 123. The gate driver GD may be formed on the circuit substrate 123 in a gate in panel (GIP) manner when various elements on the pixel substrate 121 are manufactured. Therefore, various circuit configurations which configure the gate driver GD, such as various transistors, capacitors, and wiring lines, may be disposed on the plurality of circuit substrates 123. However, it is not limited thereto and the gate driver GD may be mounted in a chip on film (COF) manner.

The power supply PS may be mounted in the plurality of circuit substrates 123. The power supply PS is a plurality of power blocks patterned when various components on the pixel substrate 121 are manufactured and may be formed on the circuit substrate 123. Therefore, power blocks disposed on different layers may be disposed on the circuit substrate 123. That is, a lower power block and an upper power block may be sequentially disposed on the circuit substrate 123. A low potential voltage may be applied to the lower power block and a high potential voltage may be applied to the upper power block. Therefore, the low potential voltage may be supplied to the plurality of pixels PX by means of the lower power block. The high potential voltage may be supplied to the plurality of pixels PX by means of the upper power block.

Referring to FIG. 1, sizes of the plurality of circuit substrates 123 may be larger than sizes of the plurality of pixel substrates 121. Specifically, a size of each of the plurality of circuit substrates 123 may be larger than a size of each of the plurality of pixel substrates 121. As described above, on each of the plurality of circuit substrates 123, the gate driver GD is disposed and one stage of the gate driver GD may be disposed on each of the plurality of circuit substrates 123. Therefore, an area occupied by various circuit configurations which configure one stage of the gate driver GD may be relatively larger than an area occupied by the pixel PX so that a size of each of the plurality of circuit substrates 123 may be larger than a size of each of the plurality of pixel substrates 121.

Even though in FIG. 1, the plurality of circuit substrates 123 is disposed on both sides of the non-active area NA in the first direction X, it is not limited thereto and may be disposed in an arbitrary area of the non-active area NA. Further, even though it is illustrated that the plurality of pixel substrates 121 and the plurality of circuit substrates 123 have a quadrangular shape, it is not limited thereto and the plurality of pixel substrates 121 and the plurality of circuit substrates 123 may vary in various forms.

Referring to FIGS. 1 and 3, the plurality of connection substrates 122 may be disposed between the plurality of pixel substrates 121 to connect pixel substrates 121 which are adjacent to each other in the active area AA. The plurality of connection substrates 122 may be disposed between the pixel substrate 121 and the circuit substrate 123 which are adjacent to each other or between the plurality of adjacent circuit substrates 123 to connect the pixel substrate 121 and the circuit substrate 123 which are adjacent to each other in the non-active area NA or to connect the plurality of circuit substrates 123 which is adjacent to each other.

Referring to FIG. 1, the plurality of connection substrates 122 has a wavy shape. For example, the plurality of connection substrates 122 may have a sine wave shape. However, the shape of the plurality of connection substrates 122 is not limited thereto, and for example, the plurality of connection substrates 122 may extend in a zigzag shape. Alternatively, the plurality of connection substrates 122 may have various shapes, such as a plurality of diamond-shaped substrates connected and extended at vertices. Further, the number and the shape of the plurality of connection substrates 122 illustrated in FIG. 1 are illustrative and the number and the shape of the plurality of connection substrates 122 may vary depending on the design.

The plurality of pixel substrates 121 and the plurality of circuit substrates 123 are rigid patterns. That is, the plurality of pixel substrates 121 and the plurality of circuit substrates 123 may be more rigid than the lower substrate 111 and the upper substrate 112. Accordingly, the moduli of elasticity of the plurality of pixel substrates 121 and the plurality of circuit substrates 123 may be higher than the modulus of elasticity of the lower substrate 111. The modulus of elasticity is a parameter representing a rate of deformation against the stress applied to the substrate and the higher the modulus of elasticity, the higher the hardness. Therefore, the plurality of pixel substrates 121 and the plurality of circuit substrates 123 may be referred to as a plurality of first rigid patterns and a plurality of second rigid patterns, respectively. The moduli of elasticity of the plurality of pixel substrates 121 and the plurality of circuit substrates 123 may be 1000 times higher than the moduli of elasticity of the lower substrate 111 and the upper substrate 112, but are not limited thereto.

The plurality of pixel substrates 121 and the plurality of circuit substrates 123 which are the plurality of rigid substrates may be formed of plastic material having a flexibility lower than that of the lower substrate 111 and the upper substrate 112. For example, the plurality of pixel substrates 121 and the plurality of circuit substrates 123 may be formed of polyimide (PI), polyacrylate, polyacetate, or the like. In this case, the plurality of pixel substrates 121 and the plurality of circuit substrates 123 may be formed of the same material, but are not limited thereto and may be formed of different materials. When the plurality of pixel substrates 121 and the plurality of circuit substrates 123 are formed of the same material, the plurality of pixel substrates 121 and the plurality of circuit substrates 123 may be integrally formed.

In some exemplary embodiments, the lower substrate 111 may be defined to include a plurality of first lower patterns and a second lower pattern. The plurality of first lower patterns may be an area of the lower substrate 111 overlapping the plurality of pixel substrates 121 and the plurality of circuit substrates 123. The second lower pattern may be an area which does not overlap the plurality of pixel substrates 121 and the plurality of circuit substrates 123.

Further, the upper substrate 112 may be defined to include a plurality of first upper patterns and a second upper pattern. The plurality of first upper patterns may be an area of the upper substrate 112 overlapping the plurality of pixel substrates 121 and the plurality of circuit substrates 123 and the second upper pattern may be an area which does not overlap the plurality of pixel substrates 121 and the plurality of circuit substrates 123.

At this time, moduli of elasticity of the plurality of first lower patterns and the first upper pattern may be higher than moduli of elasticity of the second lower pattern and the second upper pattern. For example, the plurality of first lower patterns and the first upper pattern may be formed of the same material as the plurality of pixel substrates 121 and the plurality of circuit substrates 123. The second lower pattern and the second upper pattern may be formed of a material having a modulus of elasticity lower than those of the plurality of pixel substrates 121 and the plurality of circuit substrate 123.

That is, the first lower pattern and the first upper pattern may be formed of polyimide (PI), polyacrylate, polyacetate, or the like. Further, the second lower pattern and the second upper pattern may be formed of a silicon rubber such as polydimethylsiloxane (PDMS) or an elastomer such as polyurethane (PU) or polytetrafluoroethylene (PTFE).

Driving Element of Non-Active Area

The gate driver GD is a component which supplies a gate voltage to the plurality of pixels PX disposed in the active area AA. The gate driver GD includes a plurality of stages formed on the plurality of circuit substrates 123 and each stage of the gate driver GD may be electrically connected to each other by means of the plurality of gate connection lines. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage. The power supply PS is connected to the plurality of pixels PX to supply a pixel driving voltage to each of the plurality of pixels PX. The power supply PS may also be formed on the plurality of circuit substrates 123. That is, the power supply PS may be formed to be adjacent to the gate driver GD on the circuit substrate 123. Power supplies PS formed on the plurality of circuit substrates 123 may be electrically connected to the gate driver GD and the plurality of pixels PX, respectively. That is, the plurality of power supplies PS formed on the plurality of circuit substrates 123 may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from the control unit to the display element. Therefore, the printed circuit board PCB may also be referred to as a driving substrate. A control unit such as an IC chip or a circuit unit may be mounted on the printed circuit board PCB. Further, on the printed circuit board PCB, a memory, a processor, or the like may also be mounted. The printed circuit board PCB provided in the display device 100 may include a stretching area and a non-stretching area to ensure stretchability. In the non-stretching area, an IC chip, a circuit unit, a memory, processor, and the like may be mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD is configured as an IC chip so that it may be also referred to as a data-integrated circuit D-IC. The data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a chip on film (COF) manner, it is not limited thereto and the data driver DD may be mounted by a chip on board (COB), a chip on glass (COG), or a tape carrier package (TCP) manner.

Further, even though in FIG. 1, one data driver DD is disposed so as to correspond to one line of the pixel substrate 121 disposed in the active area AA, it is not limited thereto. That is, one data driver DD may be disposed so as to correspond to a plurality of lines of pixel substrates 121.

Hereinafter, the active area AA of the display device 100 according to the exemplary embodiment of the present disclosure will be described in more detail with reference to FIGS. 4 and 5 together.

Planar and Cross-Sectional Structures of Active Area

Figure 4:
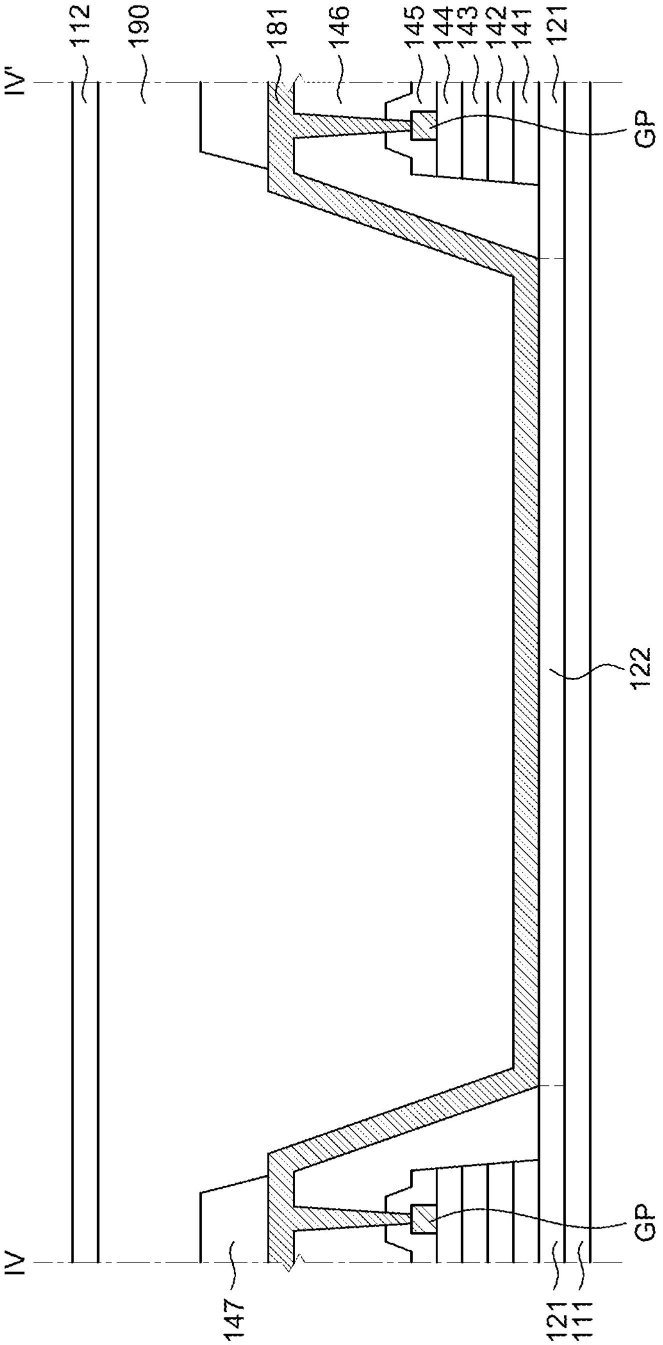
FIG. 4 is a cross-sectional view taken along the line IV-IV' of FIG. 2.

FIG. 4 is a cross-sectional view taken along the line IV-IV' of FIG. 2.

Figure 5:
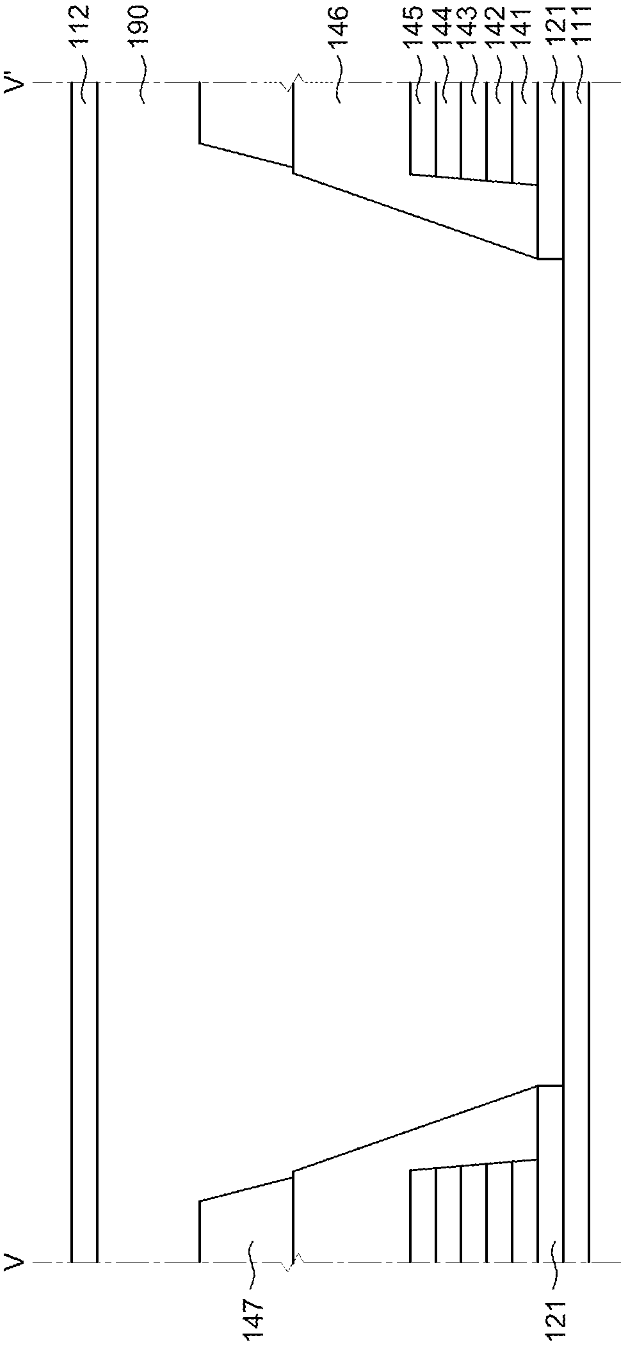
FIG. 5 is a cross-sectional view taken along the line V-V' of FIG. 2.

FIG. 5 is a cross-sectional view taken along the line V-V' of FIG. 2.

For the convenience of description, the description will be made with reference to FIGS. 1 to 3 together.

Referring to FIGS. 1 and 2, the plurality of pixel substrates 121 is disposed on the lower substrate 111 in the active area AA. The plurality of pixel substrates 121 is spaced apart from each other to be disposed on the lower substrate 111. For example, as illustrated in FIG. 1, the plurality of pixel substrates 121 may be disposed on the lower substrate 111 in a matrix, but is not limited thereto.

Referring to FIGS. 2 and 3, a pixel PX including the plurality of sub pixels SPX is disposed in the pixel substrate 121. Each sub pixel SPX may include an LED 170 which is a display element and a driving transistor 160 and a switching transistor 150 which drive the LED 170. However, in the sub pixel SPX, the display element is not limited to an LED, and may also be changed to an organic light emitting diode. Further, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to a plurality of connection lines 181 and 182. Therefore, the plurality of connection lines 181 and 182 may include a first connection line 181 extending in the first direction X and the second connection line 182 extending in the second direction Y.

Hereinafter, a cross-sectional structure of the active area AA will be described in detail with reference to FIG. 3.

Referring to FIG. 3, a plurality of inorganic insulating layers is disposed on the plurality of pixel substrates 121. For example, the plurality of inorganic insulating layers may include a buffer layer 141, a gate insulating layer 142, a first interlayer insulating layer 143, a second interlayer insulating layer 144, and a passivation layer 145, but is not limited thereto. Therefore, on the plurality of pixel substrates 121, various inorganic insulating layers may be additionally disposed or one or more of the buffer layer 141, the gate insulating layer 142, the first interlayer insulating layer 143, the second interlayer insulating layer 144, and the passivation layer 145 which are inorganic insulating layers may be omitted.

Specifically, the buffer layer 141 is disposed on the plurality of pixel substrates 121. The buffer layer 141 is formed on the plurality of pixel substrates 121 to protect various components of the display device 100 from permeation of moisture $H_2O$ and oxygen $O_2$ from the outside of the lower substrate 111 and the plurality of pixel substrates 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

In this case, the buffer layer 141 may be formed only in an area of the lower substrate 111 overlapping the plurality of pixel substrates 121 and the plurality of circuit substrates 123. As described above, the buffer layer 141 may be formed of an inorganic material so that the buffer layer 141 may be easily cracked or damaged during a process of stretching the display device 100. In this case, the buffer layer 141 is not formed in an area between the plurality of pixel substrates 121 and the plurality of circuit substrates 123, but is patterned to have the shape of the plurality of pixel substrates 121 and the plurality of circuit substrates 123. Therefore, the buffer layer 141 may be formed only above the plurality of pixel substrates 121 and the plurality of circuit substrates 123. Therefore, in the display device 100 according to the exemplary embodiment of the present disclosure, the buffer layer 141 is formed only in an area overlapping the plurality of pixel substrates 121 and the plurality of circuit substrates 123 which are rigid patterns. Therefore, even though the display device 100 is bent or extended to be deformed, the damage of various components of the display device 100 may be suppressed.

Referring to FIG. 3, a switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, referring to FIG. 1, the active layer 152 of the switching transistor 150 and the active layer 162 of the driving transistor 160 are disposed on the buffer layer 141. For example, the active layer 152 of the switching transistor 150 and the active layer 162 of the driving transistor 160 may be formed of oxide semiconductors. For example, the active layer 151 may be formed of indium-gallium-zinc oxide, indium-gallium oxide, or indium-zinc oxide. Alternatively, the active layer 152 of the switching transistor 150 and the active layer 162 of the driving transistor 160 may be formed of amorphous silicon (a-Si), polycrystalline silicon (poly-Si), an organic semiconductor, or the like.

The gate insulating layer 142 is disposed on the active layer 152 of the switching transistor 150 and the active layer 162 of the driving transistor 160. The gate insulating layer 142 is a layer which electrically insulates the gate electrode 151 of the switching transistor 150 from the active layer 152 of the switching transistor 150 and electrically insulates the gate electrode 161 of the driving transistor 160 from the active layer 162 of the driving transistor 160. The gate insulating layer 142 may be formed of an insulating material. For example, the gate insulating layer 142 may be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. The gate electrode 151 of the switching transistor 150 overlaps the active layer 152 of the switching transistor 150 and the gate electrode 161 of the driving transistor 160 overlaps the active layer 162 of the driving transistor 160.

Each of the gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may be formed of an inorganic material, similarly to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM is disposed on the first interlayer insulating layer 143. The intermediate metal layer IM overlaps the gate electrode 161 of the driving transistor 160. Therefore, a storage capacitor is formed in an overlapping area of the intermediate metal layer IM and the gate electrode 161 of the driving transistor 160. Specifically, the gate electrode 161 of the driving transistor 160, the first interlayer insulating layer 143, and the intermediate metal layer IM form the storage capacitor. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. The second interlayer insulating layer 144 insulates the intermediate metal layer IM from the source electrode and the drain electrode 164 of the driving transistor 160. The second interlayer insulating layer 144 may be formed of an inorganic material, similarly to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 are disposed on the second interlayer insulating layer 144. The source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Even though in FIG. 1, the source electrode of the driving transistor 160 is omitted, the source electrode of the driving transistor 160 is also disposed to be spaced apart from the drain electrode 164 on the same layer. In the switching transistor 150, the source electrode 153 and the drain electrode 154 may be in contact with the active layer 152 to be electrically connected to the active layer 152. In the driving transistor 160, the source electrode and the drain electrode 164 may be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure may also be used. Further, in this specification, the transistor may be formed not only to have a top gate structure, but also to have a bottom gate structure.

A gate pad GP and a data pad DP may be disposed on the second interlayer insulating layer 144.

Specifically, referring to FIG. 4, the gate pad GP is a pad which transmits a gate voltage to the plurality of sub pixels SPX. The gate pad GP is connected to the first connection line 181 through a contact hole. The gate voltage supplied from the first connection line 181 may be transmitted to the gate electrode 151 of the switching transistor 150 from the gate pad GP through a wiring line formed on the pixel substrate 121.

Referring to FIG. 2, the data pad DP is a pad which transmits a data voltage to the plurality of sub pixels SPX. The data pad DP is connected to the second connection line 182 through a contact hole. The data voltage supplied from the second connection line 182 may be transmitted to the source electrode 153 of the switching transistor 150 from the data pad DP through a wiring line formed on the pixel substrate 121.

Referring to FIG. 3, the voltage pad VP is a pad which transmits a low potential voltage to the plurality of sub pixels SPX. The voltage pad VP is connected to the first connection line 181 through a contact hole. The low potential voltage supplied from the first connection line 181 may be transmitted to the n-electrode 174 of the LED 170 from the voltage pad VP through a second contact pad CNT2 formed on the pixel substrate 121.

The voltage pad VP, the gate pad GP, and the data pad DP may be formed of the same material as the source electrode 153 and the drain electrodes 154 and 164, but are not limited thereto.

Referring to FIG. 1, the passivation layer 145 is formed on the switching transistor 150 and the driving transistor 160. That is, the passivation layer 145 covers the switching transistor 150 and the driving transistor 160 to protect the switching transistor 150 and the driving transistor 160 from the permeation of moisture and oxygen. The passivation layer 145 may be formed of an inorganic material and configured by a single layer or a double layer, but is not limited thereto.

The gate insulating layer 142, the first interlayer insulating layer 143, the second interlayer insulating layer 144, and the passivation layer 145 are patterned to be formed only in an area overlapping the plurality of pixel substrates 121. The gate insulating layer 142, the first interlayer insulating layer 143, the second interlayer insulting layer 144, and the passivation layer 145 may be also formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of pixel substrates 121, but are patterned to have a shape of the plurality of pixel substrates 121 to be formed only above the plurality of pixel substrates 121.

The planarization layer 146 is formed on the passivation layer 145. The planarization layer 146 planarizes upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 3, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of pixel substrates 121. The planarization layer 146 encloses the buffer layer 141, the gate insulating layer 142, the first interlayer insulating layer 143, the second interlayer insulating layer 144, and the passivation layer 145 together with the plurality of pixel substrates 121. Specifically, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of pixel substrates 121. Therefore, the planarization layer 146 may compensate for a step on the side surfaces of the buffer layer 141, the gate insulating layer 142, the first interlayer insulating layer 143, the second interlayer insulating layer 144, and the passivation layer 145. Further, the planarization layer 146 may enhance an adhesive strength of the planarization layer 146 and the connection lines 181 and 182 disposed on the side surface of the planarization layer 146.

Referring to FIG. 3, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by each of the side surface of the passivation layer 145, the side surface of the first interlayer insulating layer 143, the side surface of the second interlayer insulating layer 144, the side surface of the gate insulating layer 142, and the side surface of the buffer layer 141. Therefore, the connection lines 181 and 182 which are disposed to be in contact with the side surface of the planarization layer 146 are disposed with a gentle slope so that when the display device 100 is stretched, the stress generated in the connection lines 181 and 182 may be reduced. Further, the side surface of the planarization layer 146 has a relatively gentle slope so that the crack of the connection lines 181 and 182 or separation thereof from the side surface of the planarization layer 146 may be suppressed.

Referring to FIGS. 2 to 4, the plurality of connection lines 181 and 182 is disposed on the plurality of connection substrates 122. The plurality of connection lines 181 and 182 refers to wiring lines which electrically connect the pads on the plurality of pixel substrates 121. As described above, the plurality of connection lines 181 and 182 disposed on the connection substrate 122 may also extend onto the plurality of pixel substrates 121 so as to be electrically connected to the gate pad GP and the data pad DP on the plurality of pixel substrates 121. Referring to FIG. 1, the connection substrate 122 is not disposed in an area where the connection lines 181 and 182 are not disposed, among areas between the plurality of pixel substrates 121.

The connection lines 181 and 182 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, and a reference voltage line, extend from one side to the other side of the display panel of the organic light emitting display device without being disconnected on the substrate.

In contrast, in the display device 100 according to the exemplary embodiment of the present disclosure, various wiring lines, such as a gate line, a data line, a high potential voltage line, a reference voltage line, and an initialization voltage line having a straight line shape which are considered to be used for the display panel of the general organic light emitting display device, are disposed only on the plurality of pixel substrates 121 and the plurality of circuit substrates 123. That is, in the display device 100 according to the exemplary embodiment of the present disclosure, a straight wiring line is disposed only on the plurality of pixel substrates 121 and the plurality of circuit substrates 123.

In the display device 100 according to the exemplary embodiment of the present disclosure, the pads on the two adjacent pixel substrates 121 may be connected by the connection lines 181 and 182. Accordingly, the connection lines 181 and 182 electrically connect the gate pads GP or the data pads DP on two adjacent pixel substrates 121. Accordingly, the display device 100 according to the exemplary embodiment of the present disclosure may include a plurality of connection lines 181 and 182 which electrically connects various wiring lines, such as a gate line, a data line, a high potential voltage line, and a reference voltage line, between the plurality of pixel substrates 121. For example, the gate line may be disposed on the plurality of pixel substrates 121 disposed to be adjacent to each other in the first direction X and the gate pad GP may be disposed on both ends of the gate line. In this case, the plurality of gate pads GP on the plurality of pixel substrates 121 adjacent to each other in the first direction X may be connected to each other by the first connection line 181 which serves as a gate line. Therefore, the gate line disposed on the plurality of pixel substrates 121 and the first connection line 181 disposed on the circuit substrate 123 may serve as one gate line. The gate line described above may be referred to as a scan signal line. Further, wiring lines which extend in the first direction X, among all various wiring lines which may be included in the display device 100, such as an emission signal line, a low potential voltage line, and a high potential voltage line, may also be electrically connected by the first connection line 181, as described above.

Referring to FIGS. 2 to 4, the first connection lines 181 may connect the gate pads GP on two pixel substrates 121 which are disposed side by side, among the gate pads GP on the plurality of pixel substrates 121 disposed to be adjacent in the first direction X. The first connection line 181 may serve as a gate line, an emission signal line, a high potential voltage line, or a low potential voltage line, but is not limited thereto. For example, the first connection line 181 may serve as a gate line and electrically connect the gate pads GP on two pixel substrates 121 which are disposed side by side in the first direction X. Therefore, as described above, the gate pads GP on the plurality of pixel substrates 121 disposed in the first direction X may be connected by the first connection line 181 serving as a gate line and transmit one gate voltage.

Referring to FIG. 2, the second connection line 182 may connect the data pads DP on two pixel substrates 121 which are disposed side by side, among the data pads DP on the plurality of pixel substrates 121 disposed to be adjacent in the second direction Y. The second connection line 182 may serve as a data line, a high potential voltage line, a low potential voltage line, or a reference voltage line, but is not limited thereto. For example, the second connection line 182 may serve as a data line and electrically connect the data line on two pixel substrates 121 which are disposed side by side in the second direction Y. Therefore, as described above, the internal line on the plurality of pixel substrates 121 disposed in the second direction Y may be connected by the plurality of second connection lines 182 serving as a data line and transmit one data voltage.

As illustrated in FIG. 4, the first connection line 181 may be formed to extend to a top surface of the connection substrate 122 while being in contact with a top surface and a side surface of the planarization layer 146 disposed on the pixel substrate 121. Further, as illustrated in FIG. 3, the second connection line 182 may be formed to extend to a top surface of the connection substrate 122 while being in contact with a top surface and a side surface of the planarization layer 146 disposed on the pixel substrate 121.

However, as illustrated in FIG. 5, there is no need to dispose a rigid pattern in an area where the first connection line 181 and the second connection line 182 are not disposed. Therefore, the connection substrate 122 which is a rigid pattern is not disposed below the first connection line 181 and the second connection line 182.

In the meantime, referring to FIG. 3, a bank 147 is formed on the first connection pad CNT1, the connection lines 181 and 182, and the planarization layer 146. The bank 147 is a component which divides adjacent sub pixels SPX. The bank 147 is disposed so as to cover at least a part of the pad PD, the connection lines 181 and 182, and the planarization layer 146. The bank 147 may be formed of an insulating material. Further, the bank 147 may include a black material. The bank 147 includes the black material to block wiring lines which may be visible through the active area AA. For example, the bank 147 may be formed of a transparent carbon-based mixture and specifically, include carbon black. However, it is not limited thereto and the bank 147 may be formed of a transparent insulating material. Even though in FIG. 1, it is illustrated that a height of the bank 147 is lower than a height of the LED 170, the present disclosure is not limited thereto and the height of the bank 147 may be equal to the height of the LED 170.

Referring to FIG. 3, an LED 170 is disposed on the first connection pad CNT1 and the second connection pad CNT2. The LED 170 includes an n-type layer 171, an active layer 172, a p-type layer 173, an n-electrode 174, and a p-electrode 175. The LED 170 of the display device 100 according to the exemplary embodiment of the present disclosure has a flip-chip structure in which the n-electrode 174 and the p-electrode 175 are formed on one surface.

The n-type layer 171 may be formed by injecting an n-type impurity into gallium nitride (GaN) having excellent crystallinity. The n-type layer 171 may be disposed on a separate base substrate which is formed of a material which is capable of emitting light.

The active layer 172 is disposed on the n-type layer 171. The active layer 172 is a light emitting layer which emits light in the LED 170 and may be formed of a nitride semiconductor, for example, indium gallium nitride (InGaN). The p-type layer 173 is disposed on the active layer 172. The p-type layer 173 may be formed by injecting a p-type impurity into gallium nitride (GaN).

As described above, the LED 170 according to the exemplary embodiment of the present disclosure may be manufactured by sequentially laminating the n-type layer 171, the active layer 172, and the p-type layer 173, and then etching a selected part to form the n-electrode 174 and the p-electrode 175. In this case, the selected part which is a space for separating the n-electrode 174 and the p-electrode 175 from each other may be etched to expose a part of the n-type layer 171. In other words, the surfaces of the LED 170 on which the n-electrode 174 and the p-electrode 175 are disposed are not flat surfaces, but have different heights.

As described above, the n-electrode 174 is disposed in the etched area and may be formed of a conductive material. The p-electrode 175 is disposed in an area which is not etched and may be also formed of a conductive material. For example, the n-electrode 174 is disposed on the n-type layer 171 which is exposed by the etching process and the p-electrode 175 is disposed on the p-type layer 173. The p-electrode 175 may be formed of the same material as the n-electrode 174.

An adhesive layer AD is disposed on top surfaces of the first connection pad CNT1 and the second connection pad CNT2 and between the first connection pad CNT1 and the second connection pad CNT2 so that the LED 170 may be bonded onto the first connection pad CNT1 and the second connection pad CNT2. In this case, the n-electrode 174 may be disposed on the second connection pad CNT2 and the p-electrode 175 may be disposed on the first connection pad CNT1.

The adhesive layer AD may be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. For example, the n-electrode 174 is electrically connected to the second connection pad CNT2 by means of the adhesive layer AD and the p-electrode 175 is electrically connected to the first connection pad CNT1 by means of the adhesive layer AD. That is, after applying the adhesive layer AD on the top surface of the second connection pad CNT2 and the first connection pad CNT1 using an inkjet method, and the like, the LED 170 is transferred onto the adhesive layer AD and the LED 170 is pressurized and heated. By doing this, the first connection pad CNT1 may be electrically connected to the p-electrode 175 and the second connection pad CNT2 may be electrically connected to the n-electrode 174. However, the remaining part of the adhesive layer AD excluding a part of the adhesive layer AD disposed between the n-electrode 174 and the second connection pad CNT2 and a part of the adhesive layer AD disposed between the p-electrode 175 and the first connection pad CNT1 have an insulating property. In the meantime, the adhesive layer AD may be divided to be disposed on the first connection pad CNT1 and the second connection pad CNT2, respectively.

The first connection pad CNT1 is electrically connected to the drain electrode 164 of the driving transistor 160 to be applied with a driving voltage from the driving transistor 160 to drive the LED 170. Even though in FIG. 3, it is illustrated that the first connection pad CNT1 is not in direct contact with the drain electrode 164 of the driving transistor 160, but is in indirect contact therewith, the present disclosure is not limited thereto. Therefore, the first connection pad CNT1 and the drain electrode 164 of the driving transistor 160 may be in direct contact with each other. Further, a low potential driving voltage is applied to the second connection pad CNT2 to drive the LED 170. Therefore, when the display device 100 is turned on, different voltage levels applied to the first connection pad CNT1 and the second connection pad CNT2 are transmitted to the n-electrode 174 and the p-electrode 175, respectively, so that the LED 170 emits light.

The upper substrate 112 is a substrate which supports various components disposed below the upper substrate 112. Specifically, the upper substrate 112 may be formed by coating and curing a material which configures the upper substrate 112 on the lower substrate 111 and the pixel substrate 121. The upper substrate 112 may be disposed to be in contact with the lower substrate 111, the pixel substrate 121, the connection substrate 122, and the connection lines 181 and 182.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus have a flexible property. However, the material of the upper substrate 112 is not limited thereto.

Even though not illustrated in FIG. 3, a polarization layer may be disposed on the upper substrate 112. The polarization layer may perform a function which polarizes light incident from the outside of the display device 100 to reduce the external light reflection. Further, an optical film other than the polarization layer may be disposed on the upper substrate 112.

The filling layer 190 may be disposed on the entire surface of the lower substrate 111 to be filled between the components disposed on the upper substrate 112 and the lower substrate 111. The filling layer 190 may be configured by a curable adhesive. Specifically, the material which configures the filling layer 190 is coated on the entire surface of the lower substrate 111 and then is hardened so that the filling layer 190 may be disposed between the components disposed on the upper substrate 112 and the lower substrate 111. For example, the filling layer 190 may be an optically clear adhesive (OCA) and may be configured by an acrylic adhesive, a silicon-based adhesive, and a urethane-based adhesive.

Circuit Structure and Driving Method of Active Area

Figure 6:
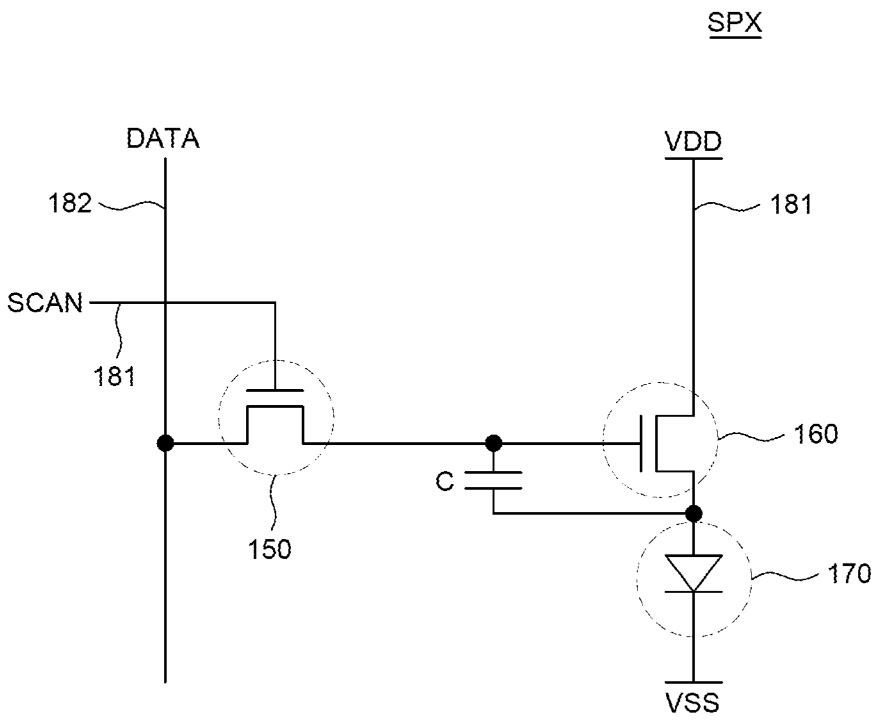
FIG. 6 is a circuit diagram of a sub pixel of a display device according to an exemplary embodiment of the present disclosure.

FIG. 6 is a circuit diagram of a sub pixel of a display device according to an exemplary embodiment of the present disclosure.

Hereinafter, for the convenience of description, a structure and an operation thereof when a sub pixel SPX of a display device 100 according to the exemplary embodiment of the present disclosure is a pixel circuit with 2T (transistor) 1C (capacitor) will be described, but the present disclosure is not limited thereto.

Referring to FIGS. 3 and 6, a sub pixel SPX of the display device 100 according to the exemplary embodiment of the present disclosure may be configured to include a switching transistor 150, a driving transistor 160, a storage capacitor C, and an LED 170.

The switching transistor 150 applies a data signal DATA supplied through the second connection line 182 to the driving transistor 160 and the storage capacitor C in accordance with a gate signal SCAN supplied through the first connection line 181.

A gate electrode 151 of the switching transistor 150 is electrically connected to the first connection line 181, a source electrode 153 of the switching transistor 150 is connected to the second connection line 182, and a drain electrode 154 of the switching transistor 150 is connected to the gate electrode 161 of the driving transistor 160.

The driving transistor 160 may operate so as to allow a driving current in accordance with the high potential power VDD supplied through the first connection line 181 and the data voltage DATA to flow in response to the data voltage DATA stored in the storage capacitor C.

A gate electrode 161 of the driving transistor 160 is electrically connected to the drain electrode 154 of the switching transistor 150, a source electrode of the driving transistor 160 is connected to the first connection line 181, and a drain electrode 164 of the driving transistor 160 is connected to the LED 170.

The LED 170 may operate to emit light in accordance with a driving current formed by the driving transistor 160. As described above, the n-electrode 174 of the LED 170 is connected to the first connection line 181 to be applied with the low potential power VSS. The p-electrode 174 of the LED 170 is connected to the drain electrode 164 of the driving transistor 160 to be applied with a driving voltage corresponding to the driving current.

As described above, the sub pixel SPX of the display device 100 according to the exemplary embodiment of the present disclosure is configured by a 2T1C structure including the switching transistor 150, the driving transistor 160, the storage capacitor C, and the LED 170. However, when a compensation circuit is added, the sub pixel may be configured in various ways, such as 3T1C, 4T2C, 5T2C, 6T1C, 6T2C, 7T1C, or 7T2C.

As described above, the display device 100 according to the exemplary embodiment of the present disclosure may include a plurality of sub pixels on a first substrate which is a rigid substrate and each of the plurality of sub pixels SPX may include a switching transistor, a driving transistor, a storage capacitor, and an LED.

Accordingly, the display device 100 according to the exemplary embodiment of the present disclosure may not only be stretched by the lower substrate 111, but also include a pixel circuit with a 2T1C structure on each first substrate to emit light according to the data voltage in accordance with each gate timing.

Hereinafter, the connection substrate 122 of the display device 100 according to an exemplary embodiment of the present disclosure will be described in more detail with reference to FIGS. 7 and 8.

Shape of Connection Line

Figure 7:
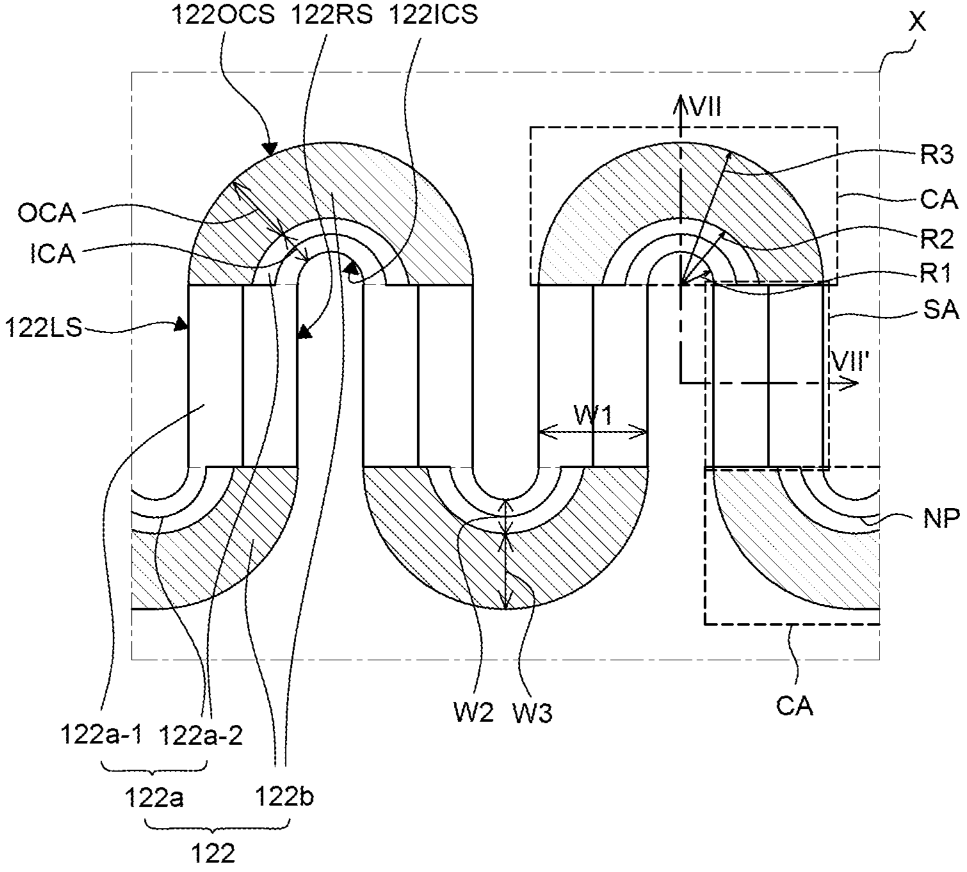
FIG. 7 is an enlarged plan view of an area of a display device according to an exemplary embodiment of the present disclosure in which a connection substrate is disposed.

FIG. 7 is an enlarged plan view of an area of a display device according to an exemplary embodiment of the present disclosure in which a connection substrate is disposed. FIG. 8 is a cross-sectional view taken along the line VIII-VIII' of FIG. 7. FIG. 7 is an enlarged plan view of an area X of FIG. 2 to illustrate only the connection substrate 122 among various components of the display device 100 for the convenience of description.

Referring to FIG. 7, a plurality of connection substrates 122 and a plurality of first connection lines 181 have wavy shapes. As described above, the plurality of connection substrates 122 and the plurality of first connection lines 181 may have various shapes such as a sine wave shape, curly shape, coil shape, or a zigzag pattern.

Therefore, the plurality of connection substrates 122 may include a straight area SA and a curved area CA. Therefore, an area in which the plurality of connection substrates 122 is disposed may be divided into a straight area SA and a curved area CA. In the straight area SA, the plurality of connection substrates 122 may straightly extend without being bent. Further, in the curved area CA, each of the plurality of connection substrates 122 may be bent with a selected curvature without extending in a straight line. However, in FIG. 7, it is illustrated that each of the plurality of connection substrates 122 is bent in the curved area CA while maintaining a selected curvature. However, the present disclosure is not limited thereto and depending on the necessity for a design, each of the plurality of connection substrates 122 may be bent in the curved area CA while maintaining a variable curvature or curved at a selected angle.

As shown in FIG. 7, a straight area SA of the connection substrate 122 has a first side 122LS and a second side 122RS opposite the first side 122LS. The curvature of the first side 122LS or the curvature of the second side 122RS may be zero, meaning that it is a flat surface or is a straight line as seen from the plan view of FIG. 7.

A curved first side 122OCS of the connection substrate 122 in the curved area CA and a curved second side 122ICS of the connection substrate 122 in the curved area CA may have a selected curvature depending on the embodiment. In one embodiment, the curvature of the curved first side 122OCS and the curvature of the curved second side 122ICS are identical to each other. However, in some embodiments, the curvature of the curved first side 122OCS and the curvature of the curved second side 122ICS may be different from each other.

In some embodiments, the first side 122LS of the connection substrate 122 in the straight area SA is continuously and contiguously connected to the curved first side 122OCS of the connection substrate 122 in the curved area CA. Similarly, the second side 122RS of the connection substrate 122 in the straight area SA is continuously and contiguously connected to the curved second side 122ICS of the connection substrate 122 in the curved area CA.

As shown in the drawings, the curved area includes an outer curved area OCA and an inner curved area ICA. The outer curved area OCA includes the second connection pattern 122*b* and the inner curved area ICA includes the first connection pattern 122*a* (particularly, 122*a*-2).

Figure 8:
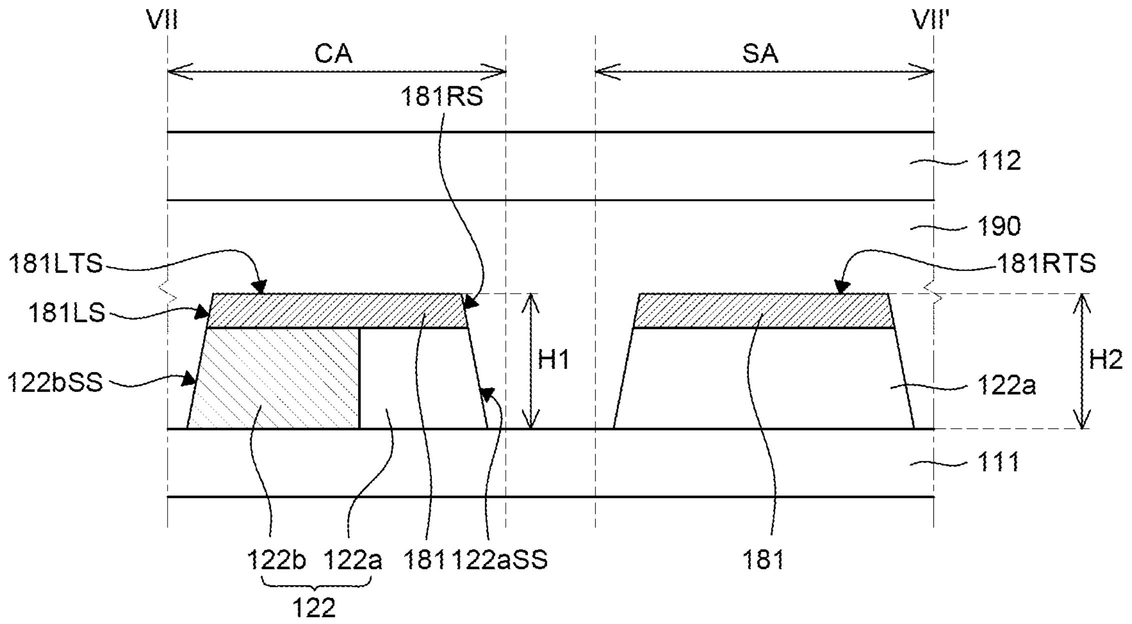
FIG. 8 is a cross-sectional view taken along the line VIII-VIII' of FIG. 7.

Referring to FIGS. 7 and 8, the connection substrate 122 may include a first connection pattern 122*a* and a second connection pattern 122*b*. For example, the first connection pattern 122*a* may be disposed in both the straight area SA and the curved area CA and the second connection pattern 122*b* may be disposed only in the curved area CA. The first connection pattern 122*a* and the second connection pattern 122*b* may be separate patterns formed of different materials. In one embodiment, the second connection pattern 122*b* does not overlap the straight area SA from a plan view.

The first connection pattern 122*a* may include a first part 122*a*-1 disposed in the straight area SA and a second part 122*a*-2 disposed in the curved area CA.

A width W2 of the second part 122*a*-2 of the first connection pattern 122*a* may be different from a width W1 of the first part 122*a*-1 of the first connection pattern 122*a*. For example, the width W2 of the second part 122*a*-2 may be smaller than the width W1 of the first part 122*a*-1. That is, the first connection pattern 122*a* may be disposed to have a smaller width than the straight area SA in the curved area CA.

The first part 122*a*-1 and the second part 122*a*-2 of the first connection pattern 122*a* may be formed with the same material to be integrally implemented. The first part 122*a*-1 and the second part 122*a*-2 of the first connection pattern 122*a* may be formed of the same material as the pixel substrate 121 and the circuit substrate 123, and for example, formed of polyimide (PI), polyacrylate, polyacetate, or the like, but are not limited thereto.

The first part 122*a*-1 and the second part 122*a*-2 of the first connection pattern 122*a* may be rigid patterns. That is, the first part 122*a*-1 and the second part 122*a*-2 of the first connection pattern 122*a* may be more rigid than the lower substrate 111 and the upper substrate 112. Accordingly, moduli of elasticity of the first part 122*a*-1 and the second part 122*a*-2 of the first connection pattern 122*a* may be higher than the modulus of elasticity of the lower substrate 111.

The second connection pattern 122*b* may be disposed along an outer circumferential surface of the first connection pattern 122*a* in the curved area CA. That is, the second connection pattern 122*b* may be disposed so as to enclose the first connection pattern 122*a* in the curved area CA. Therefore, the second connection pattern 122*b* may be disposed to have a larger radius of curvature than the second part 122*a*-2 of the first connection pattern 122*a* in the curved area CA.

The modulus of elasticity of the second connection pattern 122*b* may be different from the modulus of elasticity of the first connection pattern 122*a*. Specifically, the modulus of elasticity of the second connection pattern 122*b* may be lower than the modulus of elasticity of the first connection pattern 122*a*. For example, the second connection pattern 122*b* may be formed of a silicon rubber such as polydimethylsiloxane (PDMS) or an elastomer such as polyurethane (PU) or polytetrafluoroethylene (PTFE) and thus have a flexible property. Therefore, the connection substrate 122 may be configured with a material having a low modulus of elasticity in an area disposed with a larger radius of curvature.

When a radius of curvature of an inner circumferential surface of the connection substrate 122 is R1, a radius of curvature of an outer circumferential surface of the connection substrate 122 is R3, and a radius of curvature of an inner circumferential surface of the second connection pattern 122*b* is R2, R2 may be smaller than an average of R1 and R3. Therefore, the second connection pattern may be disposed with a width smaller than a half the width W3 of the connection substrate 122 and may be disposed with a width smaller than the second part 122*a*-2 of the first connection pattern 122*a* disposed in the curved area CA.

Further, the width W1 of the first part 122*a*-1 of the first connection pattern 122*a* may be equal to a sum of the width W2 of the second part 122*a*-2 of the first connection pattern 122*a* and the width W3 of the second connection pattern 122*b*. That is, a width of the connection substrate 122 disposed in the straight area SA may be disposed to have the same width as the connection substrate 122 disposed in the curved area CA so that the connection substrate 122 may be disposed with the same width on the lower substrate 111. However, the present disclosure is not limited thereto.

The connection lines 181 and 182 may be disposed on the connection substrate 122. For example, the connection lines 181 and 182 may be a gate line which transmits a gate voltage and a high potential voltage line which transmits a high potential voltage. In FIGS. 2 and 7, even though it is illustrated that the connection lines 181 and 182 are disposed on the first connection patterns 122*a*, it is not limited thereto.

The connection lines 181 and 182 disposed on the connection substrate 122 may be disposed so as to overlap a neutral plane (NP; see FIG. 7) of the connection substrate 122. For example, the connection substrate 122 is bent in the curved area CA with a constant curvature so that the connection substrate 122 may form a neutral plane (NP) in the curved area CA.

The neutral plane may mean a virtual plane that is not applied with a stress because the compressive force and the tensile force applied to the connection substrate are canceled each other when the connection substrate is stretched. Accordingly, in order to reduce or minimize the compressive force and the tensile force applied to the connection lines 181 and 182, the connection lines 181 and 182 may be located on the neutral plane NP of the connection substrate 122. Therefore, the connection lines 181 and 182 overlap the neutral plane NP of the connection substrate 122 to reduce or minimize the crack generated in the connection lines 181 and 182.

In the meantime, a material with a low modulus of elasticity may be applied with a relatively small stress for the same amount of deformation. Therefore, a larger stress may be applied to the outer surface of the second connection pattern 122*b* configured with a material with a low modulus of elasticity than an inner surface of the first connection pattern 122*a*. Therefore, the neutral plane NP may move to inside of the first connection pattern 122*a* of the connection substrate 122. Therefore, the neutral plane NP in the curved area CA may be disposed to be adjacent to the inner surface of the connection substrate 122, between the inner surface and the outer surface of the connection substrate 122.

Referring to FIG. 8, the cross-sectional view along VII-VII' show that the cross-sections of 112*a*, 112*b*, and 181 have a trapezoidal shape. In one embodiment, a side surface 122*b*SS of the second connection pattern 122*b* is coplanar with a side surface 181LS of the first connection line 181. Similarly, a side surface 122*a*SS of the first connection pattern 122*a* is coplanar with an opposite side surface 181RS of the first connection line 181. A height H1 is defined between a top surface 181LTS of the first connection line 181 and a top surface of the lower substrate 111. Similarly, a height H2 is defined between a top surface 181RTS of the first connection line 181 and a top surface of the lower substrate 111. In one embodiment, the height H1 and height H2 are identical to each other. However, in other embodiments, the height H1 and height H2 may be different from each other.

In the display device of the related art, when the display device is stretched, there is a high possibility of cracks occurring in the plurality of connection lines due to the stretching stress applied to the plurality of connection lines in the curved area so that there is a problem of physical and electrical disconnection. Therefore, in order to ensure the lifespan of the connection line, the stretching rate of the connection line may be improved by reducing a thickness of the connection line, but there is a problem in that the resistance of the connection line is increased in accordance with the reduction of the thickness of the connection line. Specifically, the connection line may be more easily damaged by the tensile stress, than the compressive stress.

Therefore, in the display device 100 according to the exemplary embodiment of the present disclosure, a plurality of connection patterns having different moduli of elasticity is disposed below the connection lines 181 and 182 to reduce a stretching stress applied to the connection lines 181 and 182. For example, the second connection pattern 122*b* configured with a material having a low modulus of elasticity is disposed at the outside of the connection substrate 122 to which the relatively larger tensile stress is applied in the curved area CA so that the tensile stress applied to the outer surface of the connection substrate 122 may be reduced. That is, the second connection pattern 122*b* configured with a material having a modulus of elasticity lower than the inside of the connection substrate 122 is disposed at the outside of the connection substrate 122 to which a relatively larger tensile stress is applied. Therefore, a tensile stress applied to the connection lines 181 and 182 disposed at the outside of the connection substrate 122 may be reduced so that the stretching rate of the connection substrate 122 and the connection lines 181 and 182 may be improved. Therefore, the fatigue life of the connection lines 181 and 182 may be improved.

Specifically, in the display device 100 according to the exemplary embodiment of the present disclosure, a tensile stress which is applied to the connection lines 181 and 182 may be reduced without separately deforming the connection lines 181 and 182. That is, the connection substrate 122 having a plurality of connection patterns having different moduli of elasticity is simply disposed below the connection lines 181 and 182 while maintaining a width or a thickness of the connection lines 181 and 182. By doing this, it is possible to reduce the tensile stress which is applied to the connection lines 181 and 182 and improve the stretching rate.

Hereinafter, the effect of the display device 100 according to the exemplary embodiment of the present disclosure will be described with reference to Table 1.

TABLE 1

| | Comparative Exemplary Embodiment | Exemplary Embodiment |
|---|---|---|
| Tensile stress | 6.51 MPa | 5.93 MPa |
| Fatigue life | 2410 Times | 3124 Times |

In Table 1, Exemplary Embodiment is the display device 100 according to the exemplary embodiment of the present disclosure illustrated in FIGS. 1 to 8 and Comparative Exemplary Embodiment is an example that the connection substrate is configured only with a single pattern formed of polyimide (PI) in the display device according to the exemplary embodiment of the present disclosure. The tensile stress indicates a maximum tensile stress when the connection lines 181 and 182 are stretched and the fatigue life refers to a time when the crack is generated in the connection lines 181 and 182 when the tensile line is repeatedly stretched.

Referring to Table 1, as compared with Comparative Exemplary Embodiment, in the display device 100 according to the exemplary embodiment of the present disclosure, it is confirmed that the tensile stress is reduced by approximately 10% and the fatigue life is improved by approximately 30%.

Hereinafter, a display device according to another exemplary embodiment of the present disclosure will be described. The display device according to another exemplary embodiment of the present disclosure is different from the display device according to the exemplary embodiment of the present disclosure in that an opening groove is added, which will be described in detail. In the display device according to another exemplary embodiment of the present disclosure and the display device according to the exemplary embodiment of the present disclosure, like component is denoted by like reference numeral and a specific description thereof will be omitted.

Another Exemplary Embodiment of Present Disclosure

Figure 9A:
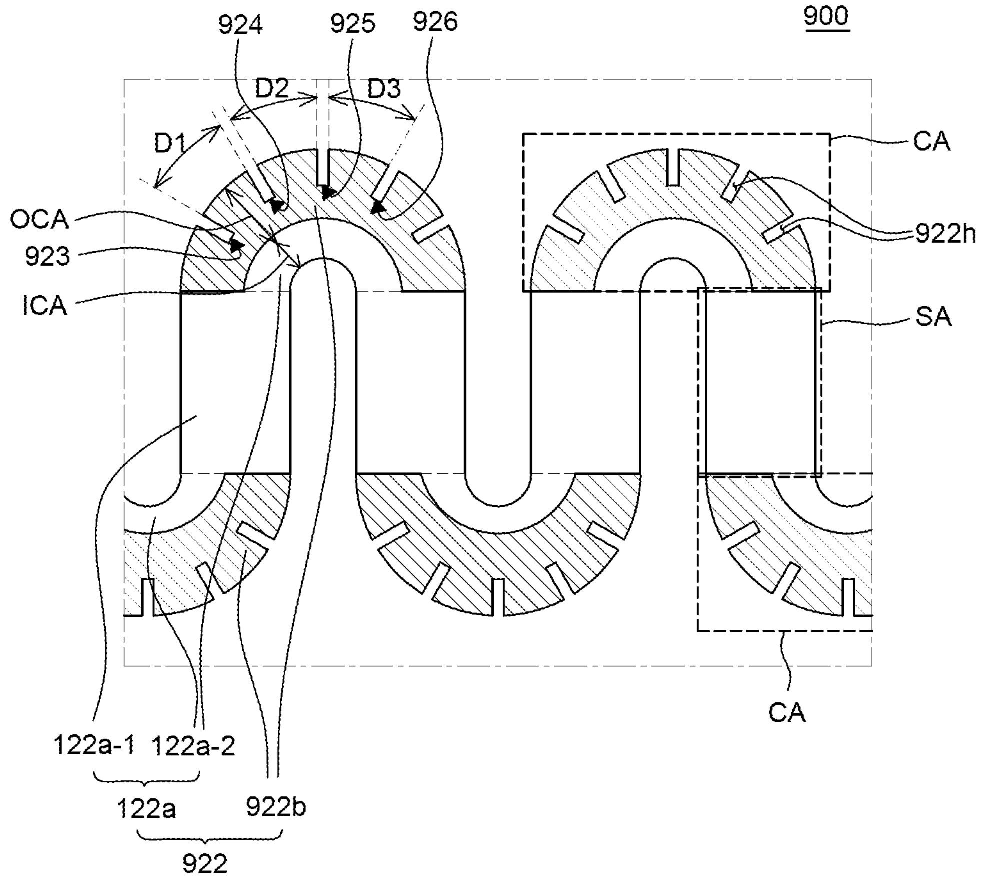
FIG. 9A is an enlarged plan view of an area of a display device according to another exemplary embodiment of the present disclosure in which a connection substrate is disposed.
Figure 9B:
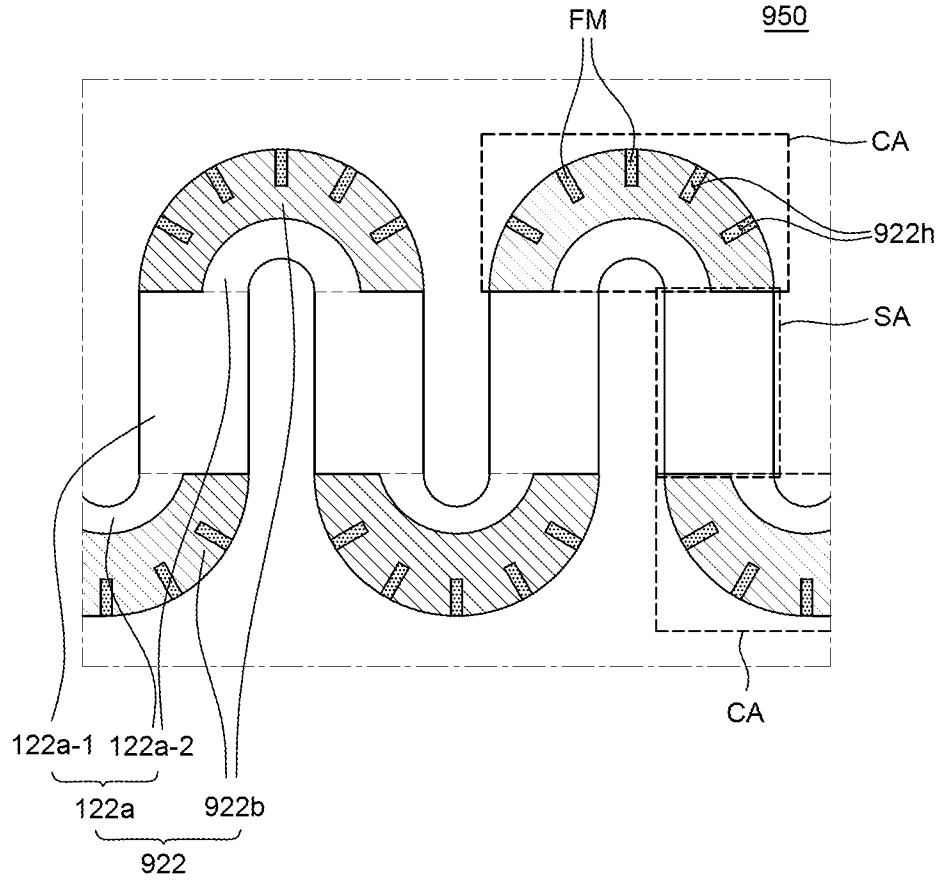
FIG. 9B is a view showing a filling member filled in a plurality of opening grooves shown in FIG. 9A.

FIG. 9A is an enlarged plan view of an area of a display device according to another exemplary embodiment of the present disclosure in which a connection substrate is disposed. FIG. 9B is a view showing a filling member filled in a plurality of opening grooves shown in FIG. 9A.

In FIGS. 9A and 9B, for the convenience of description, among various configurations of the display device 900, only a connection substrate 922 is illustrated. The only difference between a display device 900 of FIG. 9A and the display device 100 of FIGS. 1 to 8 is the connection substrate 922, but the other configuration is substantially the same, so that a redundant description will be omitted. Further, the only difference between a display device 900 of FIG. 9A and a display device 950 of FIG. 9B is the filling member filled in the plurality of opening grooves 922*h*.

Referring to FIG. 9A, the connection substrate 922 includes a plurality of opening grooves 922*h* in the curved area CA. The plurality of opening groove 922*h* may be disposed in an area disposed with a larger radius of curvature, of the connection substrate 922 disposed in the curved area CA. For example, the second connection pattern 922*b* disposed in the curved area CA may include a plurality of opening grooves 922*h*.

Further, as illustrated in FIG. 9A, the plurality of opening grooves 922*h* may be disposed to be perpendicular to an outer circumferential surface of the second connection pattern 922*b*. For example, the plurality of opening grooves 922*h* may be formed on the outer circumferential surface of the second connection pattern 922*b* so that the side surface of the second connection pattern 922*b* has a shape similar to a saw-toothed wheel.

In the meantime, as illustrated in FIG. 9B, the display device 900 according to another exemplary embodiment of the present disclosure may further include a filling member FM which is filled in the plurality of opening grooves 922*h*. The filling member FM may be filled in a space between the lower substrate 111 exposed by the plurality of opening grooves 922*h* and the connection lines 181 and 182 disposed on the second connection pattern 922*b*. Accordingly, the connection lines 181 and 182 disposed on the connection substrate 922 and the plurality of opening grooves 922*h* may be disposed to have a flat bottom surface.

A modulus of elasticity of the filling member FM which is filled in the plurality of opening grooves 922*h* may be lower than a modulus of elasticity of the second connection pattern 922*b*. Therefore, the filling member FM may disperse the tensile stress applied from the curved area CA and the tensile stress applied to the second connection pattern 922*b* may be reduced so that the stretching rate of the connection substrate 922 and the connection lines 181 and 182 may be improved.

In the display device 900 according to another exemplary embodiment of the present disclosure, the second connection pattern 922*b* configured with a material having a low modulus of elasticity is disposed at the outside of the connection substrate 922 to which a relatively large tensile stress is applied in the curved area CA while maintaining a width or a thickness of the connection lines 181 and 182. By doing this, the stretching rates of the connection substrate 922 and the connection lines 181 and 182 may be improved and the fatigue life of the connection lines 181 and 182 may be improved.

Further, the display device 900 according to another exemplary embodiment of the present disclosure includes the plurality of opening grooves 922*h* to disperse the tensile stress applied from the curved area CA. Specifically, in the display device 900 according to another exemplary embodiment of the present disclosure, the connection substrate 922 may be flexibly deformed with respect to the stress which is applied to the connection substrate 922 by the plurality of opening grooves 922*h*. Therefore, the tensile stress applied to the connection substrate 922 and the connection lines 181 and 182 disposed on the connection substrate 922 may be relieved. Accordingly, the breakage of the connection lines 181 and 182 may be reduced and the fatigue life of the connection lines 181 and 182 of the display device 900 may be improved to improve the stretching reliability of the display device 900.

Further, as shown in FIG. 9B, the display device 950 according to another exemplary embodiment of the present disclosure includes a filling member FM which is filled in the plurality of opening grooves 922*h* to disperse the tensile stress. Specifically, the modulus of elasticity of the filling member FM which is filled in the plurality of opening grooves 922*h* is lower than the modulus of elasticity of the second connection pattern 922*b* to disperse the tensile stress applied to the connection substrate 922 in the curved area CA. Further, the stretching rate of the connection substrate 922 and the connection lines 181 and 182 may be improved.

Referring to FIG. 9A, the plurality of opening grooves 922*h* includes a first opening grove 923, a second opening grove 924, a third opening grove 925, and a fourth opening grove 926. A distance between the first opening grove 923 and the second opening grove 924 is distance D1, a distance between the third opening grove 925 and the second opening grove 924 is distance D2, and a distance between the third opening grove 925 and the fourth opening grove 926 is distance D3. In one embodiment, the distance between adjacent opening grooves is identical to each other. That is, distance D1, D2, and D3 may be identical to each other and may be evenly spaced apart along the outer circumferential surface of the second connection pattern 922*b*.

In some embodiments, the distance between adjacent opening grooves may not be identical to each other. That is, distance D1, D2, and D3 may all be different from each other and therefore, may not be evenly spaced apart along the outer circumferential surface of the second connection pattern 922*b*.

As shown in the drawings, each opening groove 923, 924, 925, 926 extends toward the inner curved area ICA. However, the plurality of opening grooves 922*h* do not extend toward the inner curved area ICA so as to overlap with the inner curved area ICA.

Still Another Exemplary Embodiment of Present Disclosure

Figure 10A:
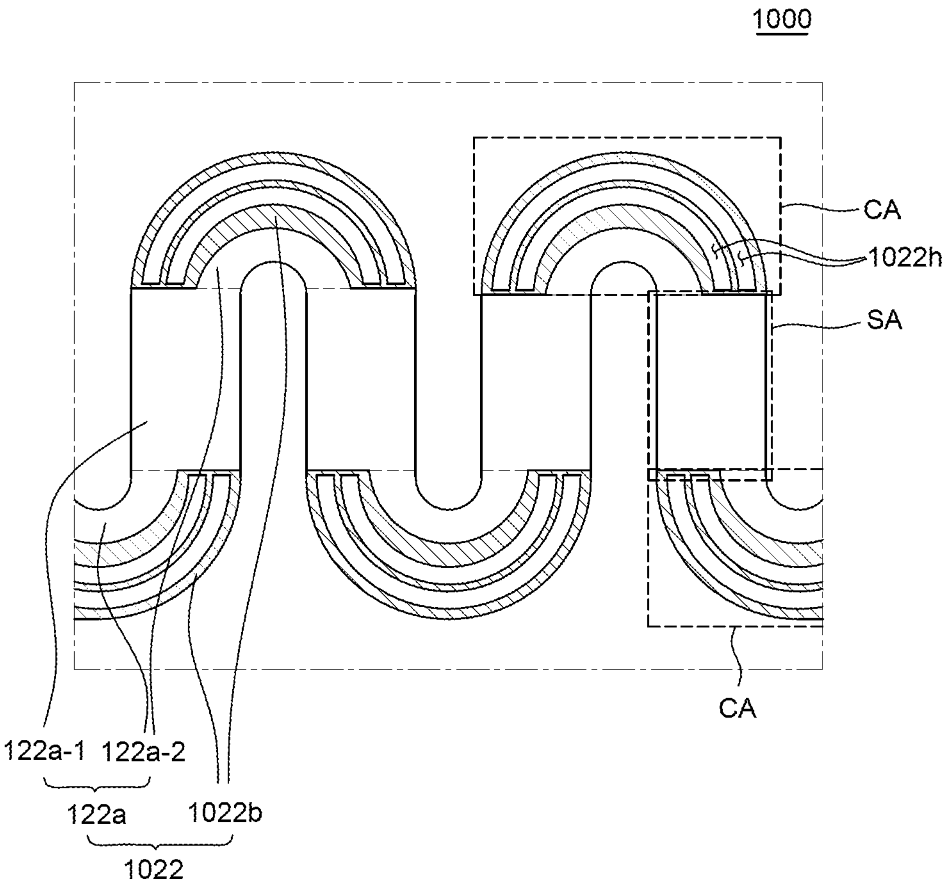
FIG. 10A is an enlarged plan view of an area of a display device according to still another exemplary embodiment of the present disclosure in which a connection substrate is disposed.
Figure 10B:
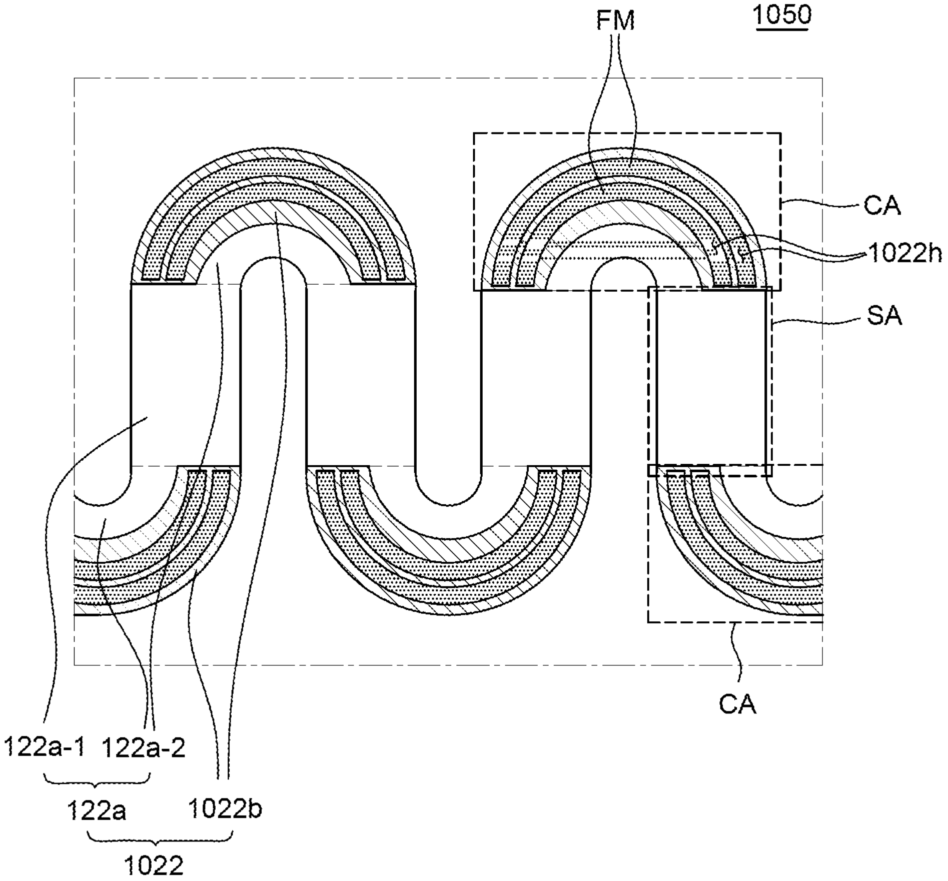
FIG. 10B is a view showing a filling member filled in a plurality of opening grooves shown in FIG. 10A.

FIG. 10A is an enlarged plan view of an area in which a connection substrate according to still another exemplary embodiment of the present disclosure is disposed. FIG. 10B is a view showing a filling member filled in a plurality of opening grooves shown in FIG. 10A. In FIGS. 10A and 10B, for the convenience of description, among various configurations of the display device 1000, only a connection substrate 1022 is illustrated. The only difference between a display device 1000 of FIG. 10A and the display device 100 of FIGS. 1 to 8 is the connection substrate 1022, but the other configuration is substantially the same, so that a redundant description will be omitted. Further, the only difference between a display device 1000 of FIG. 10A and a display device 1050 of FIG. 10B is the filling member filled in the plurality of opening grooves 1022*h*.

Referring to FIG. 10A, the connection substrate 1022 includes a plurality of opening grooves 1022*h* in the curved area CA. For example, the second connection pattern 1022*b* disposed in the curved area CA may include a plurality of opening grooves 1022*h*.

The plurality of opening grooves 1022*h* may be disposed to be bent with a selected curvature. Specifically, as illustrated in FIG. 10A, the plurality of opening grooves 1022*h* may be disposed along an outer circumferential surface of the second connection pattern 1022*b* to have a shape corresponding to the outer circumferential surface. That is, the plurality of opening grooves 1022*h* may be disposed to have the same curvature as the curvature of the outer circumferential surface of the second connection pattern 1022*b* so that the plurality of opening grooves 1022*h* have a shape corresponding to the outer circumferential surface.

As illustrated in FIG. 10B, the display device 1000 according to still another exemplary embodiment of the present disclosure further may include a filling member FM which is filled in the plurality of opening grooves 1022*h*.

The filling member may FM be configured with a material having a modulus of elasticity smaller than the second connection pattern 1022*b*. Accordingly, the filling member FM which is filled in the plurality of opening grooves 1022*h* improves the stretching rate of the connection substrate 1022 and the connection lines 181 and 182 to improve the fatigue life of the connection lines 181 and 182.

In the display device 1000 according to still another exemplary embodiment of the present disclosure, the second connection pattern 1022*b* configured with a material having a low modulus of elasticity is disposed at the outside of the connection substrate 1022 to which a relatively large tensile stress is applied from the curved area CA while maintaining a width or a thickness of the connection lines 181 and 182. By doing this, the stretching rates of the connection substrate 1022 and the connection lines 181 and 182 may be improved and the fatigue life of the connection lines 181 and 182 may be improved.

Further, the display device 1000 according to still another exemplary embodiment of the present disclosure includes a plurality of opening grooves 1022*h* so that the plurality of opening grooves 1022*h* may be flexibly deformed with respect to a stress applied to the connection substrate 1022. Therefore, the fatigue life of the connection lines 181 and 182 of the display device 1000 is improved to improve the stretching reliability of the display device 1000.

Further, as shown in FIG. 10B, the display device 1050 according to another exemplary embodiment of the present disclosure includes the filling member FM which is filled in the plurality of opening grooves 1022*h* to disperse the tensile stress. Specifically, the modulus of elasticity of the filling member FM which is filled in the plurality of opening grooves 1022*h* is lower than the modulus of elasticity of the second connection pattern 1022*b* to disperse the tensile stress applied to the connection substrate 1022 in the curved area CA. Further, the stretching rate of the connection substrate 1022 and the connection lines 181 and 182 may be improved.

Still Another Exemplary Embodiment of Present Disclosure

Figure 11A:
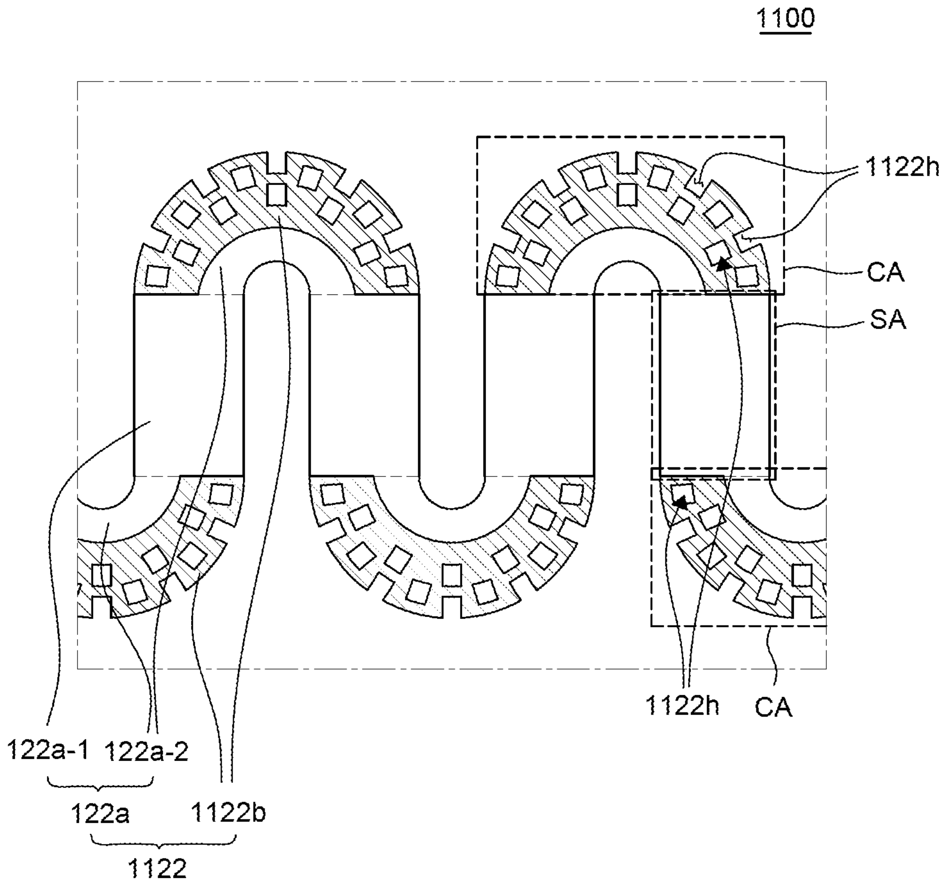
FIG. 11A is an enlarged plan view of an area of a display device according to still another exemplary embodiment of the present disclosure in which a connection substrate is disposed.
Figure 11B:
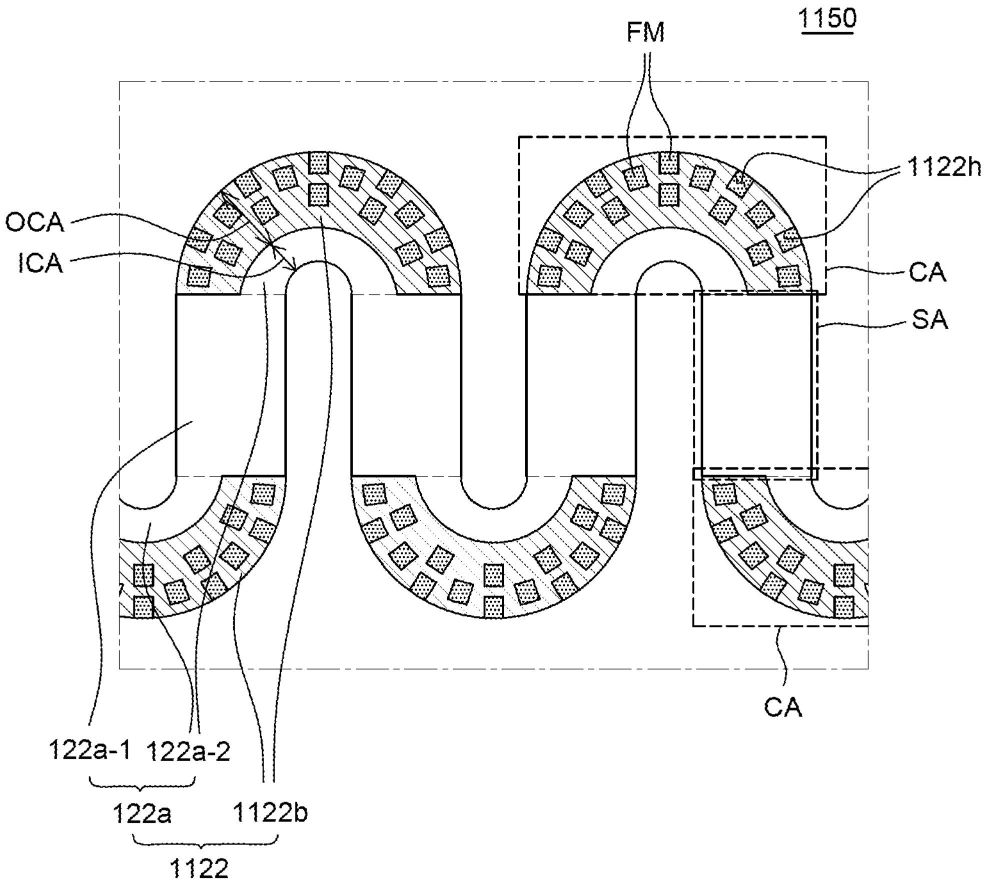
FIG. 11B is a view showing a filling member filled in a plurality of opening grooves shown in FIG. 11A.

FIG. 11A is an enlarged plan view of an area of a display device according to still another exemplary embodiment of the present disclosure in which a connection substrate is disposed. FIG. 11B is a view showing a filling member filled in a plurality of opening grooves shown in FIG. 11A. In FIG. 11A, for the convenience of description, among various configurations of the display device 1100, only a connection substrate 1122 is illustrated. The only difference between a display device 1100 of FIG. 11A and the display device 100 of FIGS. 1 to 10 is the connection substrate 1122, but the other configuration is substantially the same, so that a redundant description will be omitted. Further, the only difference between a display device 1100 of FIG. 11A and a display device 1150 of FIG. 11B is the filling member filled in the plurality of opening grooves 1122*h*.

Referring to FIG. 11A, the connection substrate 1122 includes a plurality of opening grooves 1122*h* in the curved area CA. For example, the second connection pattern 1122*b* disposed in the curved area CA may include a plurality of opening grooves 1122*h*.

The plurality of opening grooves 1122*h* may be randomly disposed in the second connection pattern 1122*b*. Therefore, the plurality of opening grooves 1122*h* may be disposed on an outer surface of the second connection pattern 1122*b* and also disposed in the inside of the second connection pattern 1122*b*. For example, the plurality of opening grooves 1122*h* includes a plurality of first opening grooves and a plurality of second opening grooves. The plurality of first opening grooves is disposed along the outermost side of the curved area and each first opening groove extends toward the inner curved area ICA. The plurality of second opening grooves is randomly dispersed within the outer curved area OCA. In one embodiment, the plurality of second opening grooves do not overlap with the plurality of first opening grooves. In some embodiments, the plurality of second opening grooves at least partially overlaps with the plurality of first opening grooves. Even though in FIG. 11A, it is illustrated that the plurality of opening grooves 1122*h* is disposed in a rectangular shape, the plurality of opening grooves 1122*h* may be disposed in various forms, such as a rhombus shape or an oval shape.

As illustrated in FIG. 11B, the display device 1100 according to still another exemplary embodiment of the present disclosure may further include a filling member FM which is filled in the plurality of opening grooves 1122*h*. The filling member FM is formed with a material having a smaller modulus of elasticity than the second connection pattern 1122*b* to improve the stretching rate of the connection lines 181 and 182 and improve the fatigue life of the connection lines 181 and 182.

In the display device 1100 according to still another exemplary embodiment of the present disclosure, the second connection pattern 1122*b* configured with a material having a low modulus of elasticity is disposed at the outside of the connection substrate 1122 to which a relatively large tensile stress is applied in the curved area CA while maintaining a width or a thickness of the connection lines 181 and 182. By doing this, the stretching rates of the connection substrate 1122 and the connection lines 181 and 182 may be improved and the fatigue life of the connection lines 181 and 182 may be improved.

Further, the display device 1100 according to still another exemplary embodiment of the present disclosure includes a plurality of opening grooves 1122*h* so that the plurality of opening grooves 1122*h* may be flexibly deformed with respect to a stress applied to the connection substrate 1122. Therefore, the stress applied to the connection substrate 1122 may be relieved so that the fatigue life of the connection lines 181 and 182 may be improved and the stretching reliability of the display device 1100 may be improved.

Further, as shown in FIG. 11B, the display device 1150 according to another exemplary embodiment of the present disclosure includes the filling member FM which is filled in the plurality of opening grooves 1122*h* to disperse the tensile stress. Specifically, the modulus of elasticity of the filling member FM which is filled in the plurality of opening grooves 1122*h* is lower than the modulus of elasticity of the second connection pattern 1122*b* to disperse the tensile stress applied to the connection substrate 1122 in the curved area CA. Further, the stretching rate of the connection substrate 1122 and the connection lines 181 and 182 may be improved.

According to an aspect of the present disclosure, a display device includes a plurality of pixel substrates disposed on a flexible substrate to be spaced apart from each other and whereon at least one pixel is disposed; a plurality of connection substrates configured to connect a plurality of adjacent pixel substrates, among the plurality of pixel substrates and include a curved area and a straight area; and a plurality of connection lines configured to electrically connect pads disposed on the plurality of adjacent pixel substrates on the plurality of connection substrates, the plurality of connection substrates includes a first connection pattern and a second connection pattern which has a different modulus of elasticity from that of the first connection pattern and is disposed only in the curved area, thereby improving a stretching reliability.

A modulus of elasticity of the second connection pattern may be lower than a modulus of elasticity of the first connection pattern.

The first connection pattern may include a first part disposed in the straight area and a second part disposed in the curved area and a width of the second part is different from a width of the first part.

The width of the second part may be smaller than the width of the first part.

The width of the first part may be equal to a sum of the width of the second part and a width of the second connection pattern.

A width of the second part of the first connection pattern may be narrower than a width of the second connection pattern.

The second connection pattern may be disposed along an outer circumferential surface of the first connection pattern.

When a radius of curvature of an inner circumferential surface of the connection substrate is R1, a radius of curvature of an outer circumferential surface of the connection substrate is R3, and a radius of curvature of an inner circumferential surface of the second connection pattern is R2, the R2 may be smaller than an average of the R1 and the R3.

The second connection pattern may include a plurality of opening grooves.

The plurality of opening grooves may be disposed to be perpendicular to an outer circumferential surface of the second connection pattern.

The plurality of opening grooves may be disposed along the outer circumferential surface of the second connection pattern.

The display device may further comprise a filling member which is filled in the plurality of opening grooves.

A modulus of elasticity of the filling member may be lower than a modulus of elasticity of the second connection pattern.

The connection line may be disposed so as to overlap a neutral plane of the connection substrate.

The neutral plane of the connection substrate may be disposed to be adjacent of an inner surface of the connection substrate, between the inner surface and an outer surface of the connection substrate, in the curved area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a plurality of pixel substrates disposed on a flexible substrate to be spaced apart from each other and whereon at least one pixel is disposed;

a plurality of connection substrates configured to connect a plurality of adjacent pixel substrates among the plurality of pixel substrates, and include a curved area and a straight area; and a plurality of connection lines configured to electrically connect pads disposed on the plurality of adjacent pixel substrates on the plurality of connection substrates, wherein the plurality of connection substrates includes a first connection pattern and a second connection pattern which has a different modulus of elasticity from that of the first connection pattern and is disposed only in the curved area; and wherein the first connection pattern and the second connection pattern are disposed in the curved area, and the plurality of connection lines are disposed on the first connection pattern and the second connection pattern disposed in the curved area.

2. The display device according to claim 1, wherein a modulus of elasticity of the second connection pattern is lower than a modulus of elasticity of the first connection pattern.

3. The display device according to claim 1, wherein the first connection pattern includes a first part disposed in the straight area and a second part disposed in the curved area and a width of the second part is different from a width of the first part.

4. The display device according to claim 3, wherein the width of the second part is smaller than the width of the first part.

5. The display device according to claim 4, wherein the width of the first part is equal to a sum of the width of the second part and a width of the second connection pattern.

6. The display device according to claim 3, wherein a width of the second part of the first connection pattern is narrower than a width of the second connection pattern.

7. The display device according to claim 1, wherein the second connection pattern is disposed along an outer circumferential surface of the first connection pattern.

8. The display device according to claim 7, wherein a radius of curvature of an inner circumferential surface of the connection substrate has a first radius R1, a radius of curvature of an inner circumferential surface of the second connection pattern has a second radius R2, and a radius of curvature of an outer circumferential surface of the connection substrate has a third radius R3, and wherein the second radius R2 is smaller than an average of the first radius R1 and the second radius R3.

9. The display device according to claim 1, wherein the second connection pattern includes a plurality of opening grooves.

10. The display device according to claim 9, wherein the plurality of opening grooves is disposed to be perpendicular to an outer circumferential surface of the second connection pattern.

11. The display device according to claim 10, wherein the plurality of opening grooves is disposed along the outer circumferential surface of the second connection pattern.

12. The display device according to claim 9, further comprising:

a filling member which is filled in the plurality of opening grooves.

13. The display device according to claim 12, wherein a modulus of elasticity of the filling member is lower than a modulus of elasticity of the second connection pattern.

14. The display device according to claim 1, wherein the connection line is disposed so as to overlap a neutral plane of the connection substrate.

15. The display device according to claim 14, wherein the neutral plane of the connection substrate is disposed to be adjacent of an inner surface of the connection substrate, between the inner surface and an outer surface of the connection substrate, in the curved area.

16. A display device, comprising:

a lower substrate;

a plurality of pixel substrates on the lower substrate and spaced apart from each other, each of the pixel substrate of the plurality having thereon at least one pixel;

a plurality of connection substrates coupled between adjacent pixel substrates of the plurality of pixel substrates, each connection substrate of the plurality of connection substrates includes a curved area and a straight area; and a plurality of connection lines on the plurality of connection substrates, wherein each connection substrate includes a first connection pattern and a second connection pattern, wherein the first connection pattern and the second connection pattern are separate patterns including different materials, wherein second connection pattern does not overlap the straight area from a plan view, and wherein the first connection pattern and the second connection pattern are disposed in the curved area, and the plurality of connection lines are disposed on the first connection pattern and the second connection pattern disposed in the curved area.

17. The display device of claim 16, wherein the first connection pattern includes the same material as the pixel substrate.

18. The display device of claim 16, wherein the first connection pattern is more rigid than the lower substrate.

19. The display device of claim 16, wherein a modulus of elasticity of the second connection pattern is lower than a modulus of elasticity of the first connection pattern.

20. The display device of claim 16, wherein the curved area includes an outer curved area and an inner curved area, and wherein the second connection pattern is disposed on the outer curved area and the first connection pattern is disposed on the inner curved area.

21. The display device of claim 20, wherein the second connection pattern includes a plurality of opening grooves, each opening groove extending toward the inner curved area.

22. The display device of claim 21, wherein the plurality of opening grooves is evenly spaced apart from each other.

23. The display device of claim 21, comprising:

a filling member included in the plurality of opening grooves, wherein a material of the filling member has a modulus of elasticity smaller than a modulus of elasticity of the second connection pattern.

24. The display device of claim 20, wherein the second connection pattern includes a plurality of opening grooves, each opening groove having a selected curvature the same as a curvature of the second connection pattern in the outer curved area.

25. The display device of claim 21, wherein the second connection pattern includes a plurality of first opening grooves, each first opening groove extending toward the inner curved area, and wherein the second connection pattern includes a plurality of second opening grooves randomly dispersed within the outer curved area.

26. The display device of claim 25, wherein the plurality of second opening grooves do not overlap with the plurality of first opening grooves.

* * * * *